(12) United States Patent
Yoon et al.

(10) Patent No.: US 10,867,997 B2
(45) Date of Patent: Dec. 15, 2020

(54) SEMICONDUCTOR DEVICE

(71) Applicant: SAMSUNG ELECTRONICS CO., LTD., Suwon-si (KR)

(72) Inventors: Changseop Yoon, Yangsan-si (KR); Jayeol Goo, Seongnam-si (KR); Sang Gil Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/829,040

(22) Filed: Mar. 25, 2020

(65) Prior Publication Data

US 2020/0227410 A1 Jul. 16, 2020

Related U.S. Application Data

(63) Continuation of application No. 16/379,908, filed on Apr. 10, 2019, now Pat. No. 10,643,995, which is a (Continued)

(30) Foreign Application Priority Data

Mar. 27, 2015 (KR) .......................... 10-2015-0043085

(51) Int. Cl.
*H01L 27/088* (2006.01)
*H01L 29/08* (2006.01)
(Continued)

(52) U.S. Cl.
CPC .... *H01L 27/088* (2013.01); *H01L 21/823456* (2013.01); *H01L 29/0847* (2013.01);
(Continued)

(58) Field of Classification Search
CPC ............. H01L 27/0886; H01L 27/0924; H01L 29/41791; H01L 23/528; H01L 23/53209;
(Continued)

(56) References Cited

U.S. PATENT DOCUMENTS 7,683,428 B2  3/2010  Chidambarrao et al.
8,377,779 B1 * 2/2013  Wang ................ H01L 29/66484
                                                     438/283

(Continued)

FOREIGN PATENT DOCUMENTS

CN    1906769 A    1/2007
CN    103187304 A  7/2013
(Continued)

*Primary Examiner* — Jonathan Han
(74) *Attorney, Agent, or Firm* — Lee IP Law, P.C.

(57) ABSTRACT

A semiconductor device includes a plurality of active patterns protruding from a substrate, a gate structure intersecting the plurality of active patterns, a plurality of source/drain regions respectively on the plurality of active patterns at opposite sides of the gate structure, and source/drain contacts intersecting the plurality of active patterns, each of the source/drain contacts connected in common to the source/drain regions thereunder, each of the plurality of source/drain regions including a first portion in contact with a top surface of the active pattern thereunder, the first portion having a width substantially increasing as a distance from the substrate increases, and a second portion extending from the first portion, the second portion having a width substantially decreasing as a distance from the substrate increases, bottom surfaces of the source/drain contacts being lower than an interface between the first and second portions.

20 Claims, 34 Drawing Sheets

Related U.S. Application Data continuation of application No. 15/724,874, filed on Oct. 4, 2017, now Pat. No. 10,283,502, which is a continuation of application No. 15/053,262, filed on Feb. 25, 2016, now abandoned.

(51) Int. Cl.
 *H01L 29/423* (2006.01)
 *H01L 29/78* (2006.01)
 *H01L 21/8234* (2006.01)
 *H01L 27/092* (2006.01)

(52) U.S. Cl.
 CPC ...... *H01L 29/4238* (2013.01); *H01L 29/7848* (2013.01); *H01L 21/823418* (2013.01); *H01L 21/823475* (2013.01); *H01L 27/0886* (2013.01); *H01L 27/092* (2013.01); *H01L 27/0924* (2013.01)

(58) Field of Classification Search
 CPC ............ H01L 27/088; H01L 27/1104; H01L 29/0653; H01L 29/0847; H01L 29/161; H01L 29/45
 See application file for complete search history.

(56) References Cited

U.S. PATENT DOCUMENTS

| | | | |
|---|---|---|---|
| 8,519,481 B2 | 8/2013 | Yuan et al. | |
| 8,637,384 B2 | 1/2014 | Ando et al. | |
| 8,679,925 B2 | 3/2014 | Wang | |
| 8,946,791 B2 | 2/2015 | Basker et al. | |
| 2013/0187228 A1* | 7/2013 | Xie | H01L 29/518 257/347 |
| 2013/0221414 A1 | 8/2013 | Zhao et al. | |
| 2013/0285194 A1 | 10/2013 | Lin et al. | |
| 2014/0042500 A1 | 2/2014 | Wann et al. | |
| 2014/0061734 A1 | 3/2014 | Basker et al. | |
| 2014/0191330 A1* | 7/2014 | Cheng | H01L 27/1211 257/390 |
| 2014/0203370 A1 | 7/2014 | Maeda et al. | |
| 2014/0225219 A1 | 8/2014 | Huang et al. | |
| 2015/0004774 A1 | 1/2015 | Kang | |
| 2015/0035017 A1 | 2/2015 | Wann et al. | |
| 2015/0048453 A1 | 2/2015 | Ching et al. | |
| 2015/0171216 A1 | 6/2015 | Xie et al. | |
| 2015/0279840 A1* | 10/2015 | Huang | H01L 21/823481 257/384 |
| 2015/0303118 A1* | 10/2015 | Wang | H01L 21/823431 257/401 |
| 2016/0111537 A1* | 4/2016 | Tsai | H01L 27/0886 257/192 |

FOREIGN PATENT DOCUMENTS

| | | |
|---|---|---|
| CN | 103367230 A | 10/2013 |
| CN | 103972285 A | 8/2014 |
| CN | 104124174 A | 10/2014 |
| CN | 104217964 A | 12/2014 |
| KR | 2001-0035659 A | 5/2001 |
| KR | 10-2001-0065293 A | 7/2001 |

\* cited by examiner

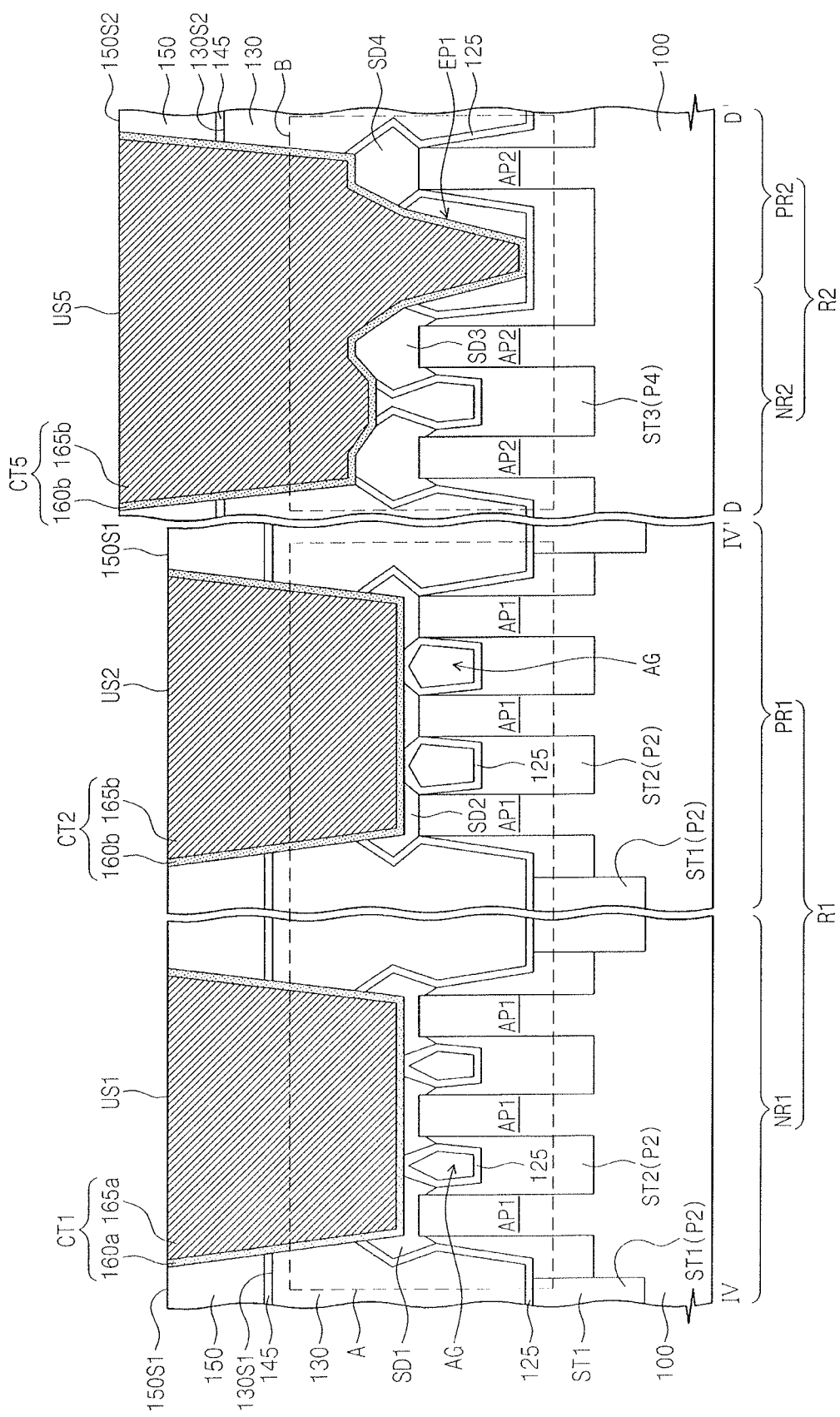

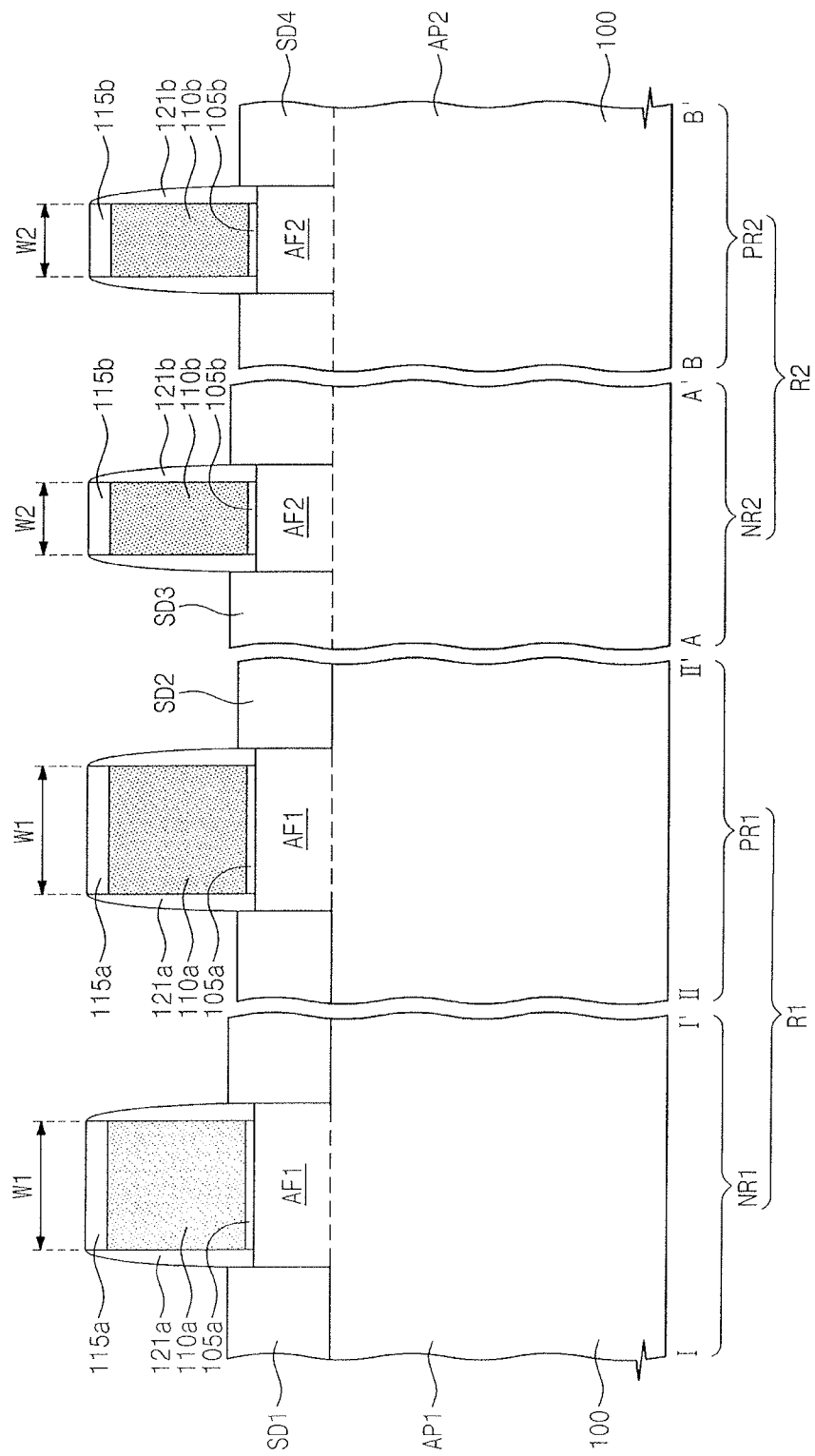

2000

3000

SEMICONDUCTOR DEVICE

CROSS-REFERENCE TO RELATED APPLICATIONS

This is a continuation application based on pending application Ser. No. 16/379,908, filed Apr. 10, 2019, which in turn is a continuation of application Ser. No. 15/724,874, filed Oct. 4, 2017, now U.S. Pat. No. 10,283,502 B2 issued May 7, 2019, which in turn is a continuation of application Ser. No. 15/053,262, filed Feb. 25, 2016, now abandoned, the entire contents of all being hereby incorporated by reference.

Korean Patent Application No. 10-2015-0043085, filed on Mar. 27, 2015, in the Korean Intellectual Property Office, and entitled: "Semiconductor Device," is incorporated by reference herein in its entirety.

BACKGROUND

1. Field

Embodiments relate to a semiconductor device and, more particularly, to a semiconductor device including a fin field effect transistor.

2. Description of the Related Art

A semiconductor device may include an integrated circuit including metal-oxide-semiconductor field effect transistors (MOSFETs). As sizes and design rules of semiconductor devices have been reduced, sizes of MOSFETs have also been scaled down. Operating characteristics of semiconductor devices may be deteriorated by the scale down of the MOSFETs. Thus, various researches are being conducted for semiconductor devices capable of overcoming limitations caused by a high integration density and of improving performance.

SUMMARY

Embodiments provide a semiconductor device capable of optimizing electrical characteristics and of improving reliability.

In one aspect, a semiconductor device may include a plurality of active patterns protruding from a substrate, a gate structure intersecting the plurality of active patterns, a plurality of source/drain regions respectively disposed on the plurality of active patterns at both sides of the gate structure, and source/drain contacts intersecting the plurality of active patterns. Each of the source/drain contacts may be connected in common to the source/drain regions disposed thereunder. Each of the plurality of source/drain regions may include a first portion being in contact with a top surface of the active pattern disposed thereunder and having a width substantially increasing as a distance from the substrate increases, and a second portion extending from the first portion and having a width substantially decreasing as a distance from the substrate increases. Bottom surfaces of the source/drain contacts may be lower than an interface between the first and second portions.

In an embodiment, the bottom surfaces of the source/drain contacts may be higher than the top surfaces of the plurality of the active patterns.

In an embodiment, the bottom surfaces of the source/drain contacts may be flat surfaces substantially parallel to a top surface of the substrate.

In an embodiment, the bottom surfaces of the source/drain contacts may include uneven and curved surfaces.

In an embodiment, the plurality of active patterns may be spaced apart from each other at substantially equal distances.

In an embodiment, each of the source/drain regions may further include a third portion disposed at a lower level than the top surfaces of the plurality of active patterns. The third portion may be in contact with sidewalls of the active pattern disposed under each of the source/drain regions. A lowermost end of the third portion may be spaced apart from the sidewalls of the active pattern.

In an embodiment, the source/drain regions may include a material of which a lattice constant is substantially equal to or smaller than that of the substrate.

In an embodiment, the source/drain regions may include a material of which a lattice constant is greater than that of the substrate.

In an embodiment, the semiconductor device may further include a device isolation pattern disposed on the substrate to partially cover sidewalls of the plurality of active patterns. The device isolation pattern may include a first region under the gate structure, and second regions at both sides of the gate structure. At least one of the second regions may include a plurality of recess regions having bottom surfaces lower than a top surface of the first region.

In an embodiment, the plurality of recess regions may include first recess regions between the plurality of active patterns, and second recess regions at both sides of the plurality of active patterns. Bottom surfaces of the first recess regions may be higher than bottom surfaces of the second recess regions.

In an embodiment, the bottom surfaces of the first recess regions may be disposed at the substantially same height.

In an embodiment, the first recess regions may include an air gap.

In an embodiment, at least one of the source/drain contacts may include an extension extending into the air gap.

In an embodiment, the semiconductor device may further include a contact etch stop layer covering inner surfaces of the first and second recess regions and extending onto the plurality of source/drain regions and sidewalls of the gate structure. The air gap may be defined by the contact etch stop layer.

In an embodiment, the gate structure may include a gate electrode intersecting the plurality of active patterns, and a gate dielectric pattern disposed between the gate electrode and the plurality of active patterns. The gate dielectric pattern may a first sub-gate dielectric pattern, and a second sub-gate dielectric pattern of which a dielectric constant is higher than that of the first sub-gate dielectric pattern.

In another aspect, a semiconductor device may include a substrate including a first region and a second region different from each other, a plurality of first active patterns protruding from the substrate of the first region and spaced apart from each other at equal distances, a plurality of second active patterns protruding from the substrate of the second region and spaced apart from each other at different distances, a first gate structure intersecting the plurality of first active patterns, a second gate structure intersecting the plurality of second active patterns, a plurality of first source/drain regions respectively disposed on the plurality of first active patterns disposed at one side of the first gate structure, a plurality of second source/drain regions respectively disposed on the plurality of second active patterns disposed at one side of the second gate structure, a first source/drain contact intersecting the plurality of first active patterns and connected in common to the plurality of first source/drain regions, and a second source/drain contact intersecting the plurality of second active patterns and connected in common to the plurality of second source/drain regions. A top surface of the first source/drain contact may be lower than a top surface of the second source/drain contact.

In an embodiment, a bottom surface of the first source/drain contact may be a flat surface substantially parallel to a top surface of the substrate.

In an embodiment, a bottom surface of the second source/drain contact may include a plurality of flat surfaces and a plurality of inclined surfaces.

In an embodiment, the bottom surface of the first source/drain contact may be lower than an uppermost one of the plurality of flat surfaces.

In an embodiment, the first gate structure may include a first gate electrode intersecting the plurality of first active patterns, and a first gate dielectric pattern disposed between the first gate electrode and the plurality of first active patterns. The second gate structure may include a second gate electrode intersecting the plurality of second active patterns, and a second gate dielectric pattern disposed between the second gate electrode and the plurality of second active patterns. A top surface of the first gate electrode may be lower than a top surface of the second gate electrode.

In an embodiment, a width of the first gate electrode may be greater than a width of the second gate electrode.

In an embodiment, the first gate dielectric pattern may include a first sub-gate dielectric pattern, and a second sub-gate dielectric pattern of which a dielectric constant is higher than that of the first sub-gate dielectric pattern.

In an embodiment, the second gate dielectric pattern may include the same material as the second sub-gate dielectric pattern.

In an embodiment, each of the plurality of first source/drain regions may include a first portion being in contact with a top surface of the first active pattern disposed thereunder and having a width substantially increasing as a distance from the substrate increases, and a second portion extending from the first portion and having a width substantially decreasing as a distance from the substrate increases. A bottom surface of the first source/drain contact may be lower than an interface between the first and second portions.

In an embodiment, the bottom surface of the first source/drain contact may be higher than the top surfaces of the plurality of first active patterns.

In an embodiment, each of the plurality of first source/drain regions may further include a third portion disposed at a lower level than the top surfaces of the plurality of first active patterns. The third portion may be in contact with sidewalls of the first active pattern disposed under each of the first source/drain regions. A lowermost end of the third portion may be spaced apart from the sidewalls of the first active pattern.

In an embodiment, the first source/drain regions may include a material of which a lattice constant is substantially equal to or smaller than that of substrate.

In an embodiment, the first source/drain regions may include a material of which a lattice constant is greater than that of the substrate.

In an embodiment, the plurality of second active patterns may include a pair of first sub-active patterns spaced apart from each other by a first distance, and a second sub-active pattern spaced apart from one of the pair of first sub-active patterns by a second distance greater than the first distance. The plurality of second source/drain regions may include first, second, and third sub-source/drain regions disposed on the pair of first sub-active patterns and the second sub-active pattern, respectively. A conductivity type of the first and second sub-source/drain regions may be different from that of the third sub-source/drain region.

In an embodiment, the second source/drain contact may include an extension extending into between the second sub-active pattern and the first sub-active pattern adjacent to the second sub-active pattern.

In yet another aspect, a semiconductor device may include a plurality of active patterns protruding from a substrate, a gate structure intersecting the plurality of active patterns, a plurality of source/drain regions respectively on the plurality of active patterns at opposite sides of the gate structure; and source/drain contacts intersecting the plurality of active patterns, each of the source/drain contacts being connected in common to the source/drain regions thereunder, wherein each of the plurality of source/drain regions includes at least one sidewalls with a triangular profile, the triangular profile having a sharp edge extending away from a sidewall of a corresponding source/drain contact, and wherein distances between a bottom of the substrate and corresponding lowermost surfaces of the source/drain contacts are smaller than respective distances of the bottom of the substrate and corresponding sharp edges.

Each of the plurality of source/drain regions may include a first portion in contact with a top surface of the active pattern thereunder, the first portion having a width substantially increasing as a distance from the bottom of the substrate increases, and a second portion extending from the first portion, the second portion having a width substantially decreasing as a distance from the bottom of the substrate increases, wherein the sharp edges of the triangular profiles are at an interface between the first an second portions.

The semiconductor device may further include air gaps among the plurality of source/drain regions, each source/drain contact being on at least one corresponding air gap.

At least one of bottom surfaces of the source/drain contacts may have a different profile than other source/drain contacts.

The at least one of the bottom surfaces of the source/drain contacts having a different profile may have a larger contact area with a corresponding source/drain region thereunder.

BRIEF DESCRIPTION OF THE DRAWINGS

Features will become apparent to those of ordinary skill in the art by describing in detail exemplary embodiments with reference to the attached drawings, in which:

FIG. 2C illustrates a cross-sectional view taken along lines IV-IV' and D-D' of FIG. 1.

FIGS. 5A to 10A illustrate cross-sectional views along lines I-I', A-A', and B-B' of FIG. 1 to illustrate stages in a method for manufacturing a semiconductor device according to example embodiments.

FIGS. 5B to 10B illustrate cross-sectional views along lines and C-C' of FIG. 1.

FIGS. 5C to 10C illustrate cross-sectional views along lines IV-IV' and D-D' of FIG. 1.

DETAILED DESCRIPTION

Figure 1:
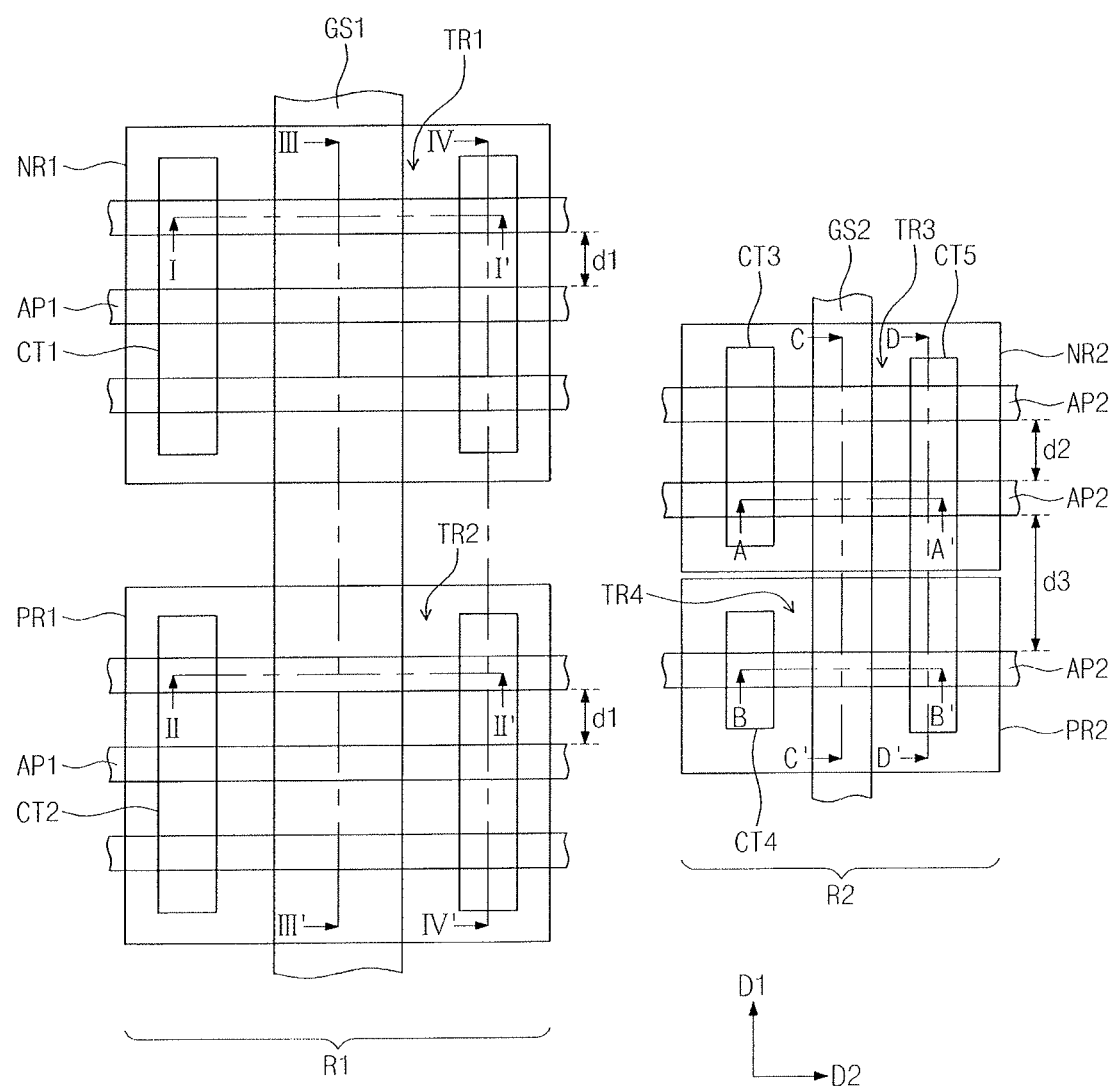
FIG. 1 illustrates a plan view of a semiconductor device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration.

The terminology used herein is for the purpose of describing particular embodiments only and is not intended to limit. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views. Accordingly, shapes of the exemplary views may be modified according to manufacturing techniques and/or allowable errors. Therefore, the embodiments include other shapes that may be created according to manufacturing processes. Areas exemplified in the drawings have general properties, and are used to illustrate specific shapes of elements that are not limited only to those illustrated. For example, an etching region illustrated as a rectangle may have rounded or curved features. Thus, the regions illustrated in the figures are schematic in nature and their shapes are not intended to limit.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure. Exemplary embodiments explained and illustrated herein include their complementary counterparts. The same reference numerals or the same reference designators denote the same elements throughout the specification.

Further, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2A:
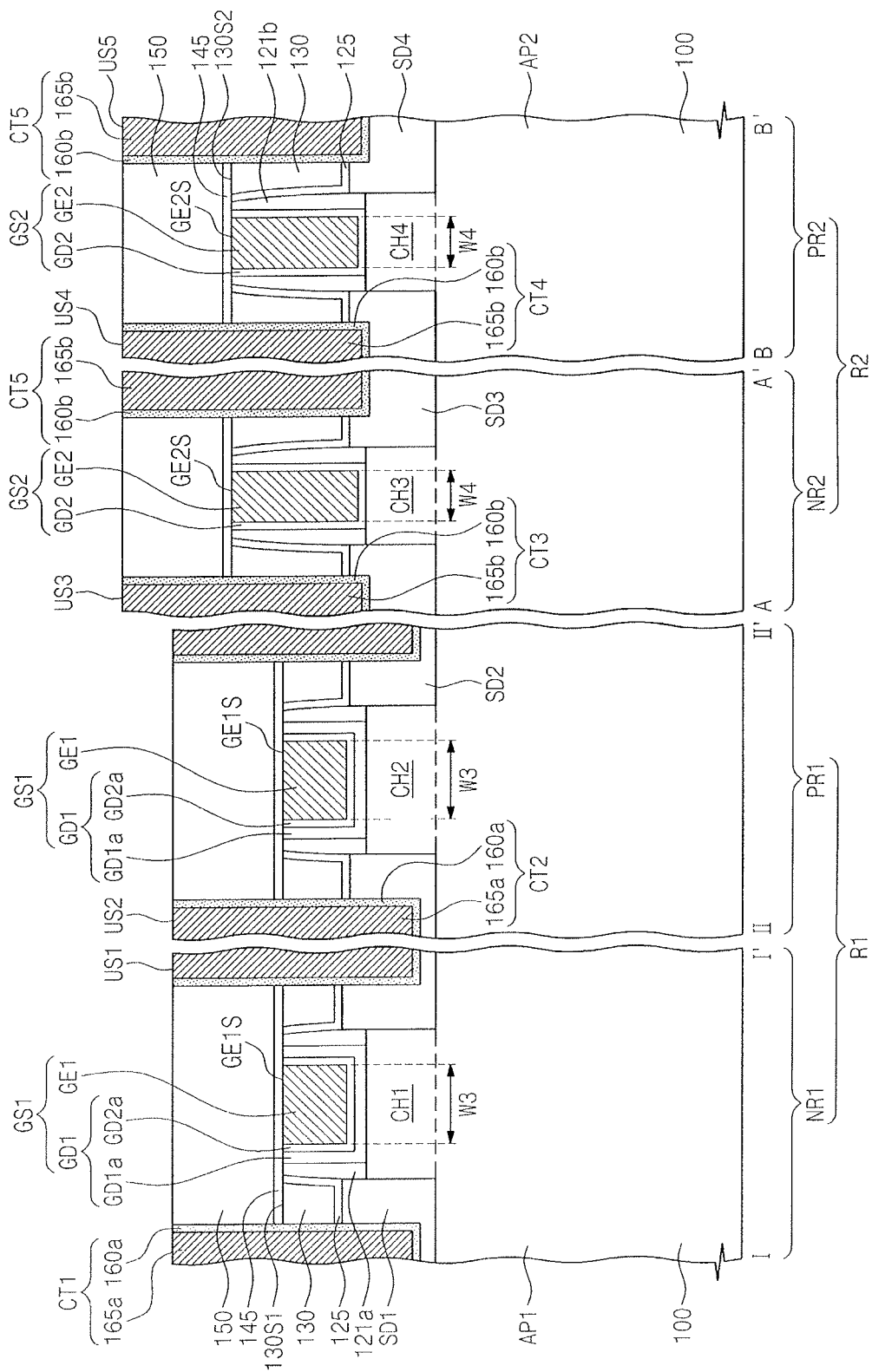
FIG. 2A illustrates a cross-sectional view taken along lines I-I', II-IF, A-A', and B-B' of FIG. 1.
Figure 2B:
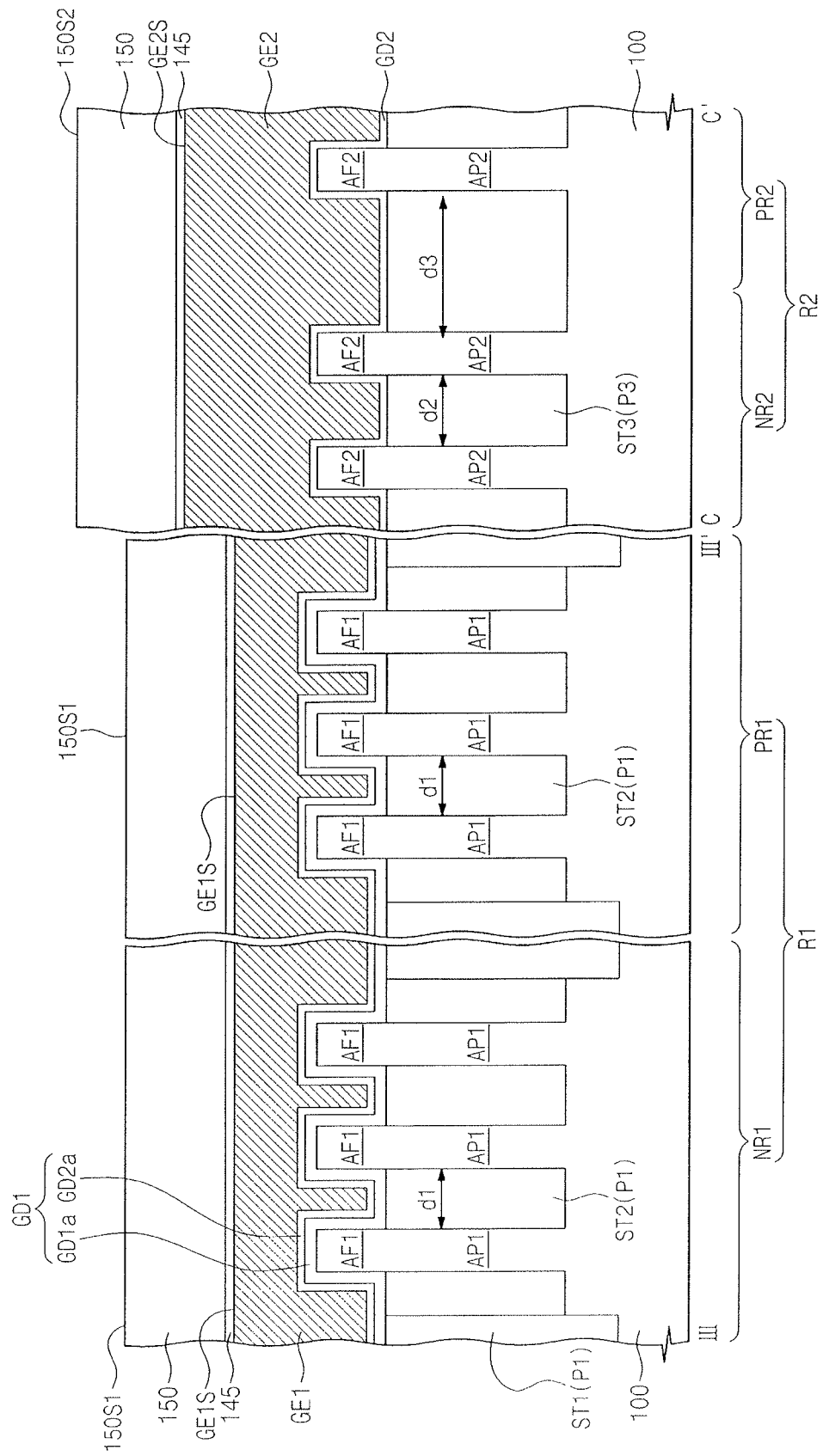
FIG. 2B illustrates a cross-sectional view taken along lines III-III' and C-C' of FIG. 1.
Figure 3A:
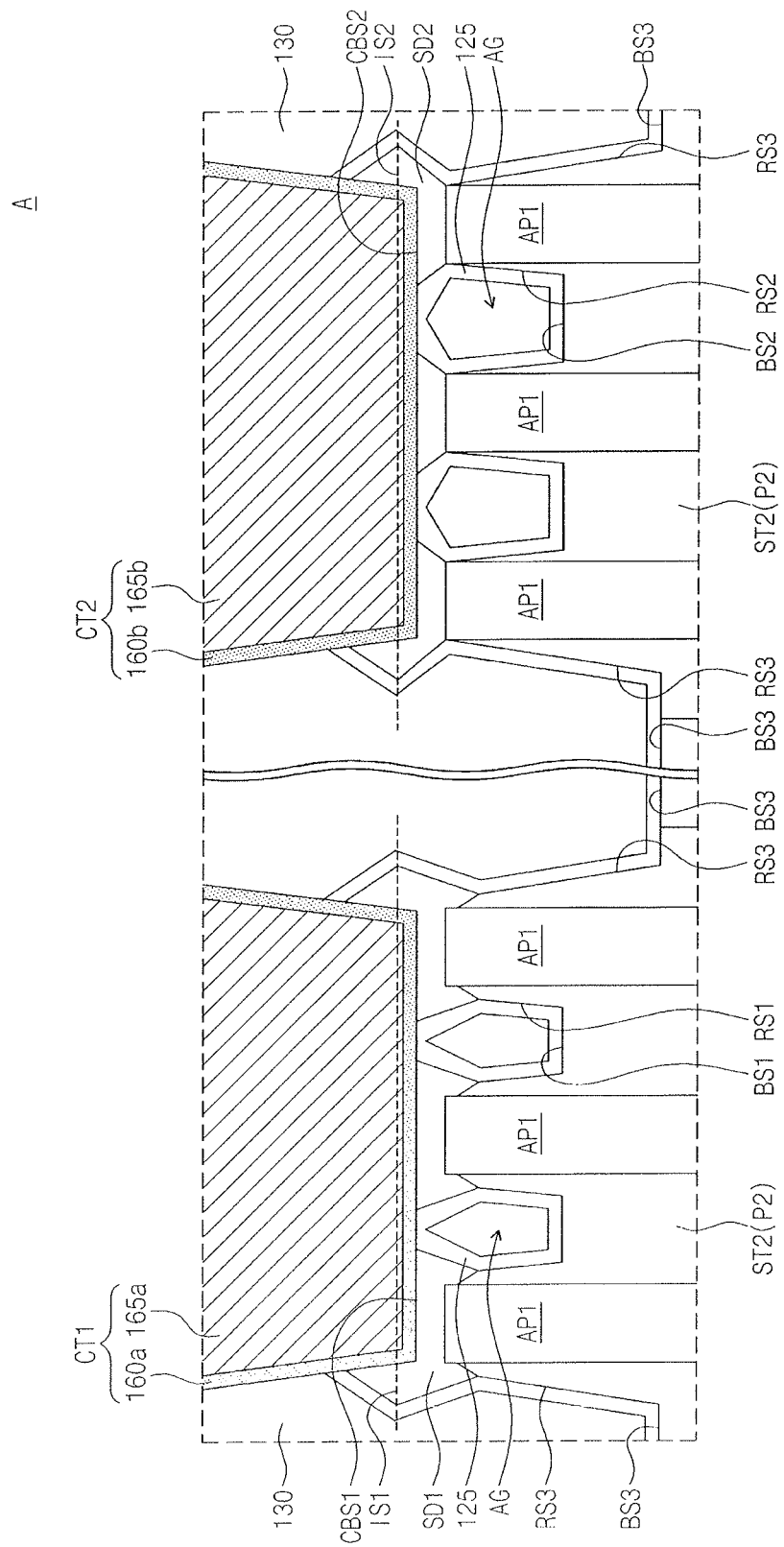
FIGS. 3A, 3B, 3C, and 3D illustrate enlarged views corresponding to a portion 'A' of FIG. 2C.
Figure 3B:
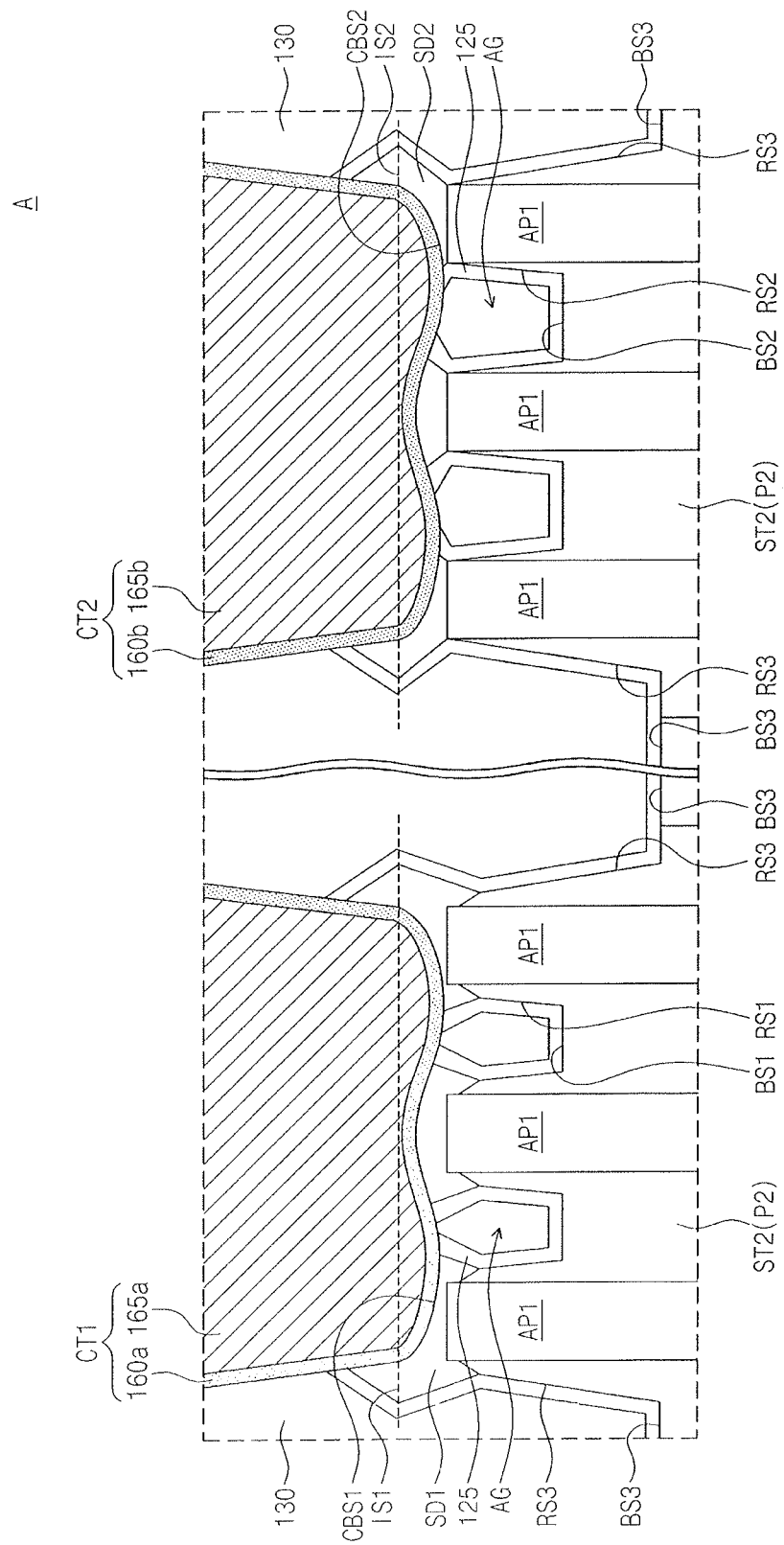
Figure 3C:
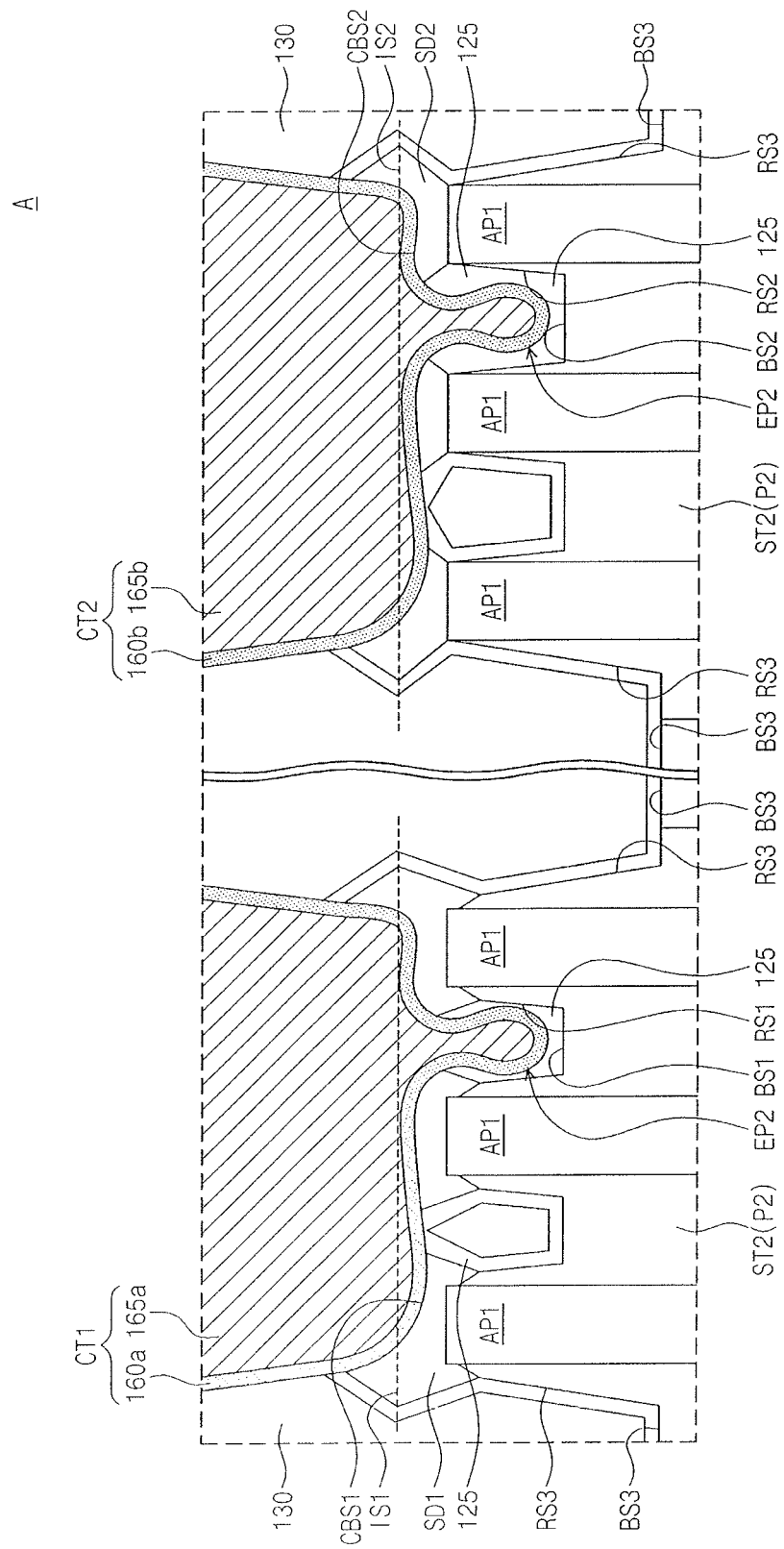

FIG. 1 is a plan view illustrating a semiconductor device according to example embodiments. FIG. 2A is a cross-sectional view taken along lines I-I', A-A', and B-B' of FIG. 1. FIG. 2B is a cross-sectional view taken along lines and C-C' of FIG. 1. FIG. 2C is a cross-sectional view taken along lines IV-IV' and D-D' of FIG. 1. FIGS. 3A, 3B, 3C, and 3D are enlarged views corresponding to a portion 'A' of FIG. 2C. FIGS. 4A, 4B, and 4C are enlarged views corresponding to a portion 'B' of FIG. 2C.

Referring to FIGS. 1, 2A, 2B, 2C, 3A, and 4A, a substrate 100 including a first region R1 and a second region R2 may be provided. The substrate 100 may be a semiconductor substrate. For example, the substrate 100 may be a silicon substrate, a germanium substrate, or a silicon-on-insulator (SOI) substrate. According to an embodiment, the first region R1 may be a portion of a logic cell region in which logic transistors constituting a logic circuit are disposed. For example, the first region R1 may be a region in which logic transistors constituting a process core or an input/output (I/O) terminal are disposed. However, embodiments are not limited thereto. The second region R2 may be a portion of a memory cell region in which a plurality of memory cells for storing data are formed. For example, memory cell transistors constituting a plurality of 6T static random access memory (6T SRAM) cells may be formed in the second region R2. Each of the 6T SRAM cells may consist of six transistors. However, embodiments are not limited thereto.

Each of the regions R1 and R2 may include an NMOSFET region NR1 or NR2 and a PMOSFET region PR1 or PR2. In the present embodiment, the NMOSFET region NR1 or NR2 may be defined as an active region on which one N-type transistor is disposed, and the PMOSFET region PR1 or PR2 may be defined as an active region on which one P-type transistor is disposed. The NMOSFET region NR1 or NR2 and the PMOSFET region PR1 or PR2 of each of the regions R1 and R2 may be arranged in, e.g., a first direction D1. However, embodiments are not limited thereto.

Active patterns may be provided on each of the regions R1 and R2. In detail, first active patterns AP1 protruding from the substrate 100 may be disposed on each of the active regions NR1 and PR1 of the first region R1. The first active patterns AP1 may be arranged, e.g., spaced apart from each other, in the first direction D1 and may have line shapes extending in a second direction D2 intersecting the first direction D1. The first active patterns AP1 of each of the active regions NR1 and PR1 may be spaced apart from each other at substantially equal distances. For example, the first active patterns AP1 of each of the active regions NR1 and PR1 may be spaced apart from each other by a first distance d1. Each of the first active patterns AP1 may be a portion of the substrate 100 or an epitaxial layer formed on the substrate 100. For example, three first active patterns AP1 are disposed on each of the active regions NR1 and PR1 of the first region R1 in FIG. 1. However, embodiments are not limited thereto, e.g., four or more first active patterns AP1 arranged at equal distances may be disposed on each of the active regions NR1 and PR1 of the first region R1.

A second active pattern AP2 may be disposed on each of the active regions NR2 and PR2 of the second region R2. The second active patterns AP2 may be arranged, e.g., spaced apart from each other, in the first direction D1 and may have line shapes extending in the second direction D2. Each of the second active patterns AP2 may be a portion of the substrate 100 or an epitaxial layer formed on the substrate 100. According to example embodiments, the second active pattern AP2 may be provided in plurality on the NMOSFET region NR2 of the second region R2. For example, two second active patterns AP2 may be disposed on the NMOSFET region NR2. However, embodiments are not limited thereto, e.g., three or more second active patterns AP2 may be provided on the NMOSFET region NR2. In this case, the three or more second active patterns AP2 may be spaced apart from each other at substantially equal distances. For example, one second active pattern AP2 may be disposed on the PMOSFET region PR2 of the second region R2. However, embodiments are not limited thereto, e.g., a plurality of second active patterns AP2 may be disposed on the PMOSFET PR2 of the second region R2.

According to example embodiments, the second active patterns AP2 of the NMOSFET region NR2 may be spaced apart from each other by a second distance d2, and the second active pattern AP2 of the PMOSFET region PR2 may be spaced apart from the second active pattern AP2 of the NMOSFET region NR2 adjacent to the PMOSFET region PR2 by a third distance d3. The third distance d3 may be greater than the second distance d2. The third distance d3 may be a minimum distance necessary to isolate the NMOSFET region NR2 from the PMOSFET region PR2 having a different conductivity type from the NMOSFET region NR2. Meanwhile, the second distance d2 may be greater than the first distance d1. Hereinafter, a pair of second active patterns AP2 on the NMOSFET region NR2 and one second active pattern AP2 on the PMOSFET region PR2 will be described as an example for the purpose of ease and convenience in explanation.

Device isolation patterns may be disposed on the substrate 100. The device isolation patterns may include first and second device isolation patterns ST1 and ST2 of the first region R1 and third device isolation patterns ST3 of the second region R2 (FIG. 2B). The first device isolation pattern ST1 may isolate the NMOSFET region NR1 and the PMOSFET region PR1 of the first region R1 from each other. For example, the NMOSFET region NR1 and the PMOSFET region PR1 may be spaced apart from each other in the first direction D1 with the first device isolation pattern ST1 interposed therebetween. The second device isolation patterns ST2 extending in the second direction D2 may be disposed at both sides of each of the first active patterns AP1. The first and second device isolation patterns ST1 and ST2 may correspond to portions of an insulating layer formed in one body.

Each of the first and second device isolation patterns ST1 and ST2 may include a first portion P1 disposed under a first gate structure GS1 (FIG. 2B) to be described later, and second portions P2 disposed at both sides of the first gate structure GS1 (FIG. 2C). The first portions P1 of the second device isolation patterns ST2 may expose upper portions of the first active patterns AP1 disposed under the first gate structure GS1. The upper portions of the first active patterns AP1, which are exposed by the first portions P1, may be defined as first active fins AF1. According to example embodiments, upper portions of the second portions P2 of the first and second device isolation patterns ST1 and ST2 may be recessed. In other words, the second portions P2 may include a plurality of recess regions. For example, as illustrated in FIG. 3A, the plurality of recess regions may include first, second, and third recess regions RS1, RS2, and RS3 disposed at one side of the first gate structure GS1. The first recess regions RS1 may be disposed between the first active patterns AP1 of the NMOSFET region NR1, and the second recess regions RS2 may be disposed between the first active patterns AP1 of the PMOSFET region PR1. The third recess region RS3 may be formed at a side of the first active pattern AP1, adjacent to the first device isolation pattern ST1, of each of the active regions NR1 and PR1.

Recessed depths of the first to third recess regions RS1 to RS3 may be different from each other by a pattern density. In other words, a recess region between first active patterns AP1 spaced apart from each other by a relatively small distance may be shallower than a recess region between the first active patterns AP1 spaced apart from each other by a relatively great distance. For example, bottom surfaces BS1 of the first recess regions RS1 may be higher, e.g., at a larger distance from a bottom of the substrate 100, than a bottom surface BS3 of the third recess region RS3. In addition, bottom surfaces BS2 of the second recess regions RS2 may also be higher, e.g., at a larger distance from a bottom of the substrate 100, than the bottom surface BS3 of the third recess region RS3. Furthermore, the bottom surfaces BS1 of the first recess regions RS1 may be disposed at a substantially same height as each other. Likewise, the bottom surfaces BS2 of the second recess regions RS2 may be disposed at a substantially same height as each other. This is because the first active patterns AP1 of each of the active regions NR1 and PR1 are arranged at equal distances. In some embodiments, the second portions P2 may expose sidewalls of the first active patterns AP1 of the NMOSFET region NR1 disposed at both sides of the first gate structure GS1 but may not expose sidewalls of the first active patterns AP1 of the PMOSFET region PR1 disposed at both sides of the first gate structure GS1. However, embodiments are not limited thereto. The first and second device isolation patterns ST1 and ST2 may include, e.g., silicon oxide.

Each of the third device isolation patterns ST3 may include a third portion P3 (FIG. 2B) disposed under a second gate structure GS2, and fourth portions P4 disposed at both sides of the second gate structure GS2. The third portions P3 of the third device isolation patterns ST3 may expose upper portions of the second active patterns AP2 disposed under the second gate structure GS2. The upper portions of the second active patterns AP2, which are exposed by the third portions P3, may be defined as second active fins AF2. According to example embodiments, upper portions of the fourth portions P4 of the third device isolation patterns ST3 may be recessed.

In other words, the fourth portions P4 may include a plurality of recess regions. For example, the plurality of recess regions of the fourth portions P4 may include fourth, fifth, and sixth recess regions RS4, RS5, and RS6 disposed at one side of the second gate structure GS2 (FIG. 4A). The fourth recess region RS4 may be disposed between the second active patterns AP2 of the NMOSFET region NR2, and the fifth recess region RS5 may be formed between the second active pattern AP2 of the PMOSFET region PR2 and the second active pattern AP2 of the NMOSFET region NR2 adjacent thereto. The sixth recess regions RS6 may be respectively disposed at both sides of the three second active patterns AP2 of the second region R2. Recessed depths of the fourth to sixth recess regions RS4 to RS6 may be different from each other by a pattern density. For example, a bottom surface BS4 of the fourth recess region RS4 may be higher than bottom surfaces BS5 and BS6 of the fifth and sixth recess regions RS5 and RS6. According to some embodiments, the fourth portions P4 may expose sidewalls of the second active patterns AP2 of the NMOSFET region NR2 disposed at both sides of the second gate structure GS2 but may not expose sidewalls of the second active pattern AP2 of the PMOSFET region PR2 disposed at both sides of the second gate structure GS2. However, embodiments are not limited thereto. The third device isolation patterns ST3 may include, e.g., silicon oxide.

As illustrated in FIG. 1, the first gate structure GS1 may be disposed on the substrate 100 of the first region R1 to intersect the first active patterns AP1, and the second gate structure GS2 may be disposed on the substrate 100 of the second region R2 to intersect the second active patterns AP2. The first gate structure GS1 may extend in the first direction D1 to intersect the NMOSFET region NR1 and the PMOSFET region PR1 of the first region R1, and the second gate structure GS2 may extend in the first direction D1 to intersect the NMOSFET region NR2 and the PMOSFET region PR2 of the second region R2. Referring to FIG. 2A, first gate spacers 121a may be disposed on both sidewalls of the first gate structure GS1 to extend along the first gate structure GS1 in the first direction D1, and second gate spacers 121b may be disposed on both sidewalls of the second gate structure GS2 to extend along the second gate structure GS2 in the first direction D1. The first and second gate spacers 121a and 121b may include a nitride, e.g., silicon nitride. In the present embodiment, the second gate structure GS2 intersects all the second active patterns AP2 of the active regions NR2 and PR2. However, embodiments are not limited thereto, e.g., the second gate structure GS2 may intersect the second active patterns AP2 of the NMOSFET region NR2 but may not be disposed on the second active pattern AP2 of the PMOSFET region PR2.

The first gate structure GS1 may include a first gate electrode GE1 covering top surfaces and sidewalls of the first active fins AF1 and a first gate dielectric pattern GD1 disposed between the first gate electrode GE1 and the first gate spacer 121a (FIG. 2B). The first gate dielectric pattern GD1 may also be disposed between the first gate electrode GE1 and the first active fins AF1, and may horizontally extend from the first active fins AF1 to cover top surfaces of the first portions P1 of the first and second device isolation patterns ST1 and ST2. In some embodiments, the first gate dielectric pattern GD1 may include a first sub-gate dielectric pattern GD1a adjacent to the first gate spacers 121a and the first active fins AF1, and a second sub-gate dielectric pattern GD2a adjacent to the first gate electrode GE1. The first and second sub-gate dielectric patterns GD1a and GD2a may have different dielectric constants from each other. In other words, the dielectric constant of the second sub-gate dielectric pattern GD2a may be higher than that of the first sub-gate dielectric pattern GD1a. For example, the first sub-gate dielectric pattern GD1a may include a silicon oxide layer or a silicon oxynitride layer, and the second sub-gate dielectric pattern GD2a may include at least one of high-k dielectric layers of which dielectric constants are higher than that of silicon oxide. For example, the high-k dielectric layers may include, but not limited to, a hafnium oxide layer, a hafnium silicate layer, a zirconium oxide layer, and a zirconium silicate layer. The first gate electrode GE1 may include at least one of a conductive metal nitride, e.g., titanium nitride or tantalum nitride, or a metal, e.g., aluminum or tungsten. Hereinafter, the first active fins AF1 of the NMOSFET region NR1 under the first gate structure GS1 may be defined as first channel regions CH1, and the first active fins AF1 of the PMOSFET region PR1 under the first gate structure GS1 may be defined as second channel regions CH2 (FIG. 2A).

The second gate structure GS2 may include a second gate electrode GE2 covering top surfaces and sidewalls of the second active fins AF2, and a second gate dielectric pattern GD2 disposed between the second gate electrode GE2 and the second gate spacer 121b. The second gate dielectric pattern GD2 may also be disposed between the second gate electrode GE2 and the second active fins AF2, and may horizontally extend from the second active fins AF2 to cover top surfaces of the third portions P3 of the third device isolation patterns ST3. The second gate electrode GE2 may include the same material as the first gate electrode GE1. In other words, the second gate electrode GE2 may include at least one of a conductive metal nitride, e.g., titanium nitride or tantalum nitride, or a metal, e.g., aluminum or tungsten. The second gate dielectric pattern GD2 may include the substantially same material as the second sub-gate dielectric pattern GD2a. In other words, the second gate dielectric pattern GD2 may include at least one of high-k dielectric layers of which dielectric constants are higher than that of silicon oxide. Hereinafter, the second active fins AF2 of the NMOSFET region NR2 under the second gate structure GS2 may be defined as third channel regions CH3, and the second active fin AF2 of the PMOSFET region PR2 under the second gate structure GS2 may be defined as a fourth channel region CH4.

According to example embodiments, a third width W3 of the first gate electrode GE1 may be greater than a fourth width W4 of the second gate electrode GE2. In some embodiments, the third width W3 may be about ten or more times greater than the fourth width W4. For example, the third width W3 may be about 200 nm, and the fourth width W4 may be 20 nm or less. A top surface GE1S of the first gate electrode GE1 may be lower, e.g., at a smaller distance from the bottom of the substrate 100, than a top surface GE2S of the second gate electrode GE2.

Source/drain regions may be disposed at both sides of each of the first and second gate structures GS1 and GS2. In detail, the source/drain regions disposed at both sides of the first gate structure GS1 may include first source/drain regions SD1 disposed on the first active patterns AP1 of the NMOSFET region NR1, and second source/drain regions SD2 disposed on the first active patterns AP1 of the PMOSFET region PR1. The first source/drain regions SD1 may have N-type conductivity, and the second source/drain regions SD2 may have P-type conductivity. In an embodiment, each of the first and second source/drain regions SD1 and SD2 may include an epitaxial pattern formed using the active pattern AP1 disposed thereunder as a seed layer. In this case, the first source/drain regions SD1 may include a material capable of providing a tensile strain to the first channel regions CHE and the second source/drain regions SD2 may include a material capable of providing a compressive strain to the second channel regions CH2. For example, if the substrate 100 is a silicon substrate, the first source/drain regions SD1 may include a silicon carbide (SiC) layer having a smaller lattice constant than silicon (Si), or a silicon layer having the substantially same lattice constant as silicon (Si). The second source/drain regions SD2 may include a silicon-germanium (SiGe) layer having a greater lattice constant than silicon (Si). Each of the first channel regions CH1 may be disposed between the first source/drain regions SD1 adjacent to each other, and each of the second channel regions CH2 may be disposed between the second source/drain regions SD2 adjacent to each other.

The source/drain regions disposed at both sides of the second gate structure GS2 may include third source/drain regions SD3 disposed on the second active patterns AP2 of the NMOSFET region NR2, and fourth source/drain regions SD4 disposed on the second active patterns AP2 of the PMOSFET region PR2. The third source/drain regions SD3 may have the N-type conductivity, and the fourth source/drain regions SD4 may have the P-type conductivity. In an embodiment, each of the third and fourth source/drain regions SD3 and SD4 may include an epitaxial pattern formed using the active pattern AP2 disposed thereunder as a seed layer. In this case, the third source/drain regions SD3 may include a material capable of providing a tensile strain to the third channel regions CH3, and the fourth source/drain regions SD4 may include a material capable of providing a compressive strain to the fourth channel regions CH4. In other words, the third and fourth source/drain regions SD3 and SD4 may include the same materials as the first and second source/drain regions SD1 and SD2 described above, respectively. Each of the third channel regions CH3 may be disposed between the third source/drain regions SD3 adjacent to each other, and each of the fourth channel regions CH4 may be disposed between the fourth source/drain regions SD4 adjacent to each other.

When viewed from a cross-sectional view, the first source/drain regions SD1 may have a different shape from the second source/drain regions SD2, and the third source/drain regions SD3 may have a different shape from the fourth source/drain regions SD4. The shapes of the third and fourth source/drain regions SD3 and SD4 may correspond to the shapes of the first and second source/drain regions SD1 and SD2, respectively. These will be described in detail with reference to FIGS. 3D and 4C. Here, FIGS. 3D and 4C illustrate one cross section of the source/drain regions which are not in contact with source/drain contacts CT1 to CT5.

Figure 3D:
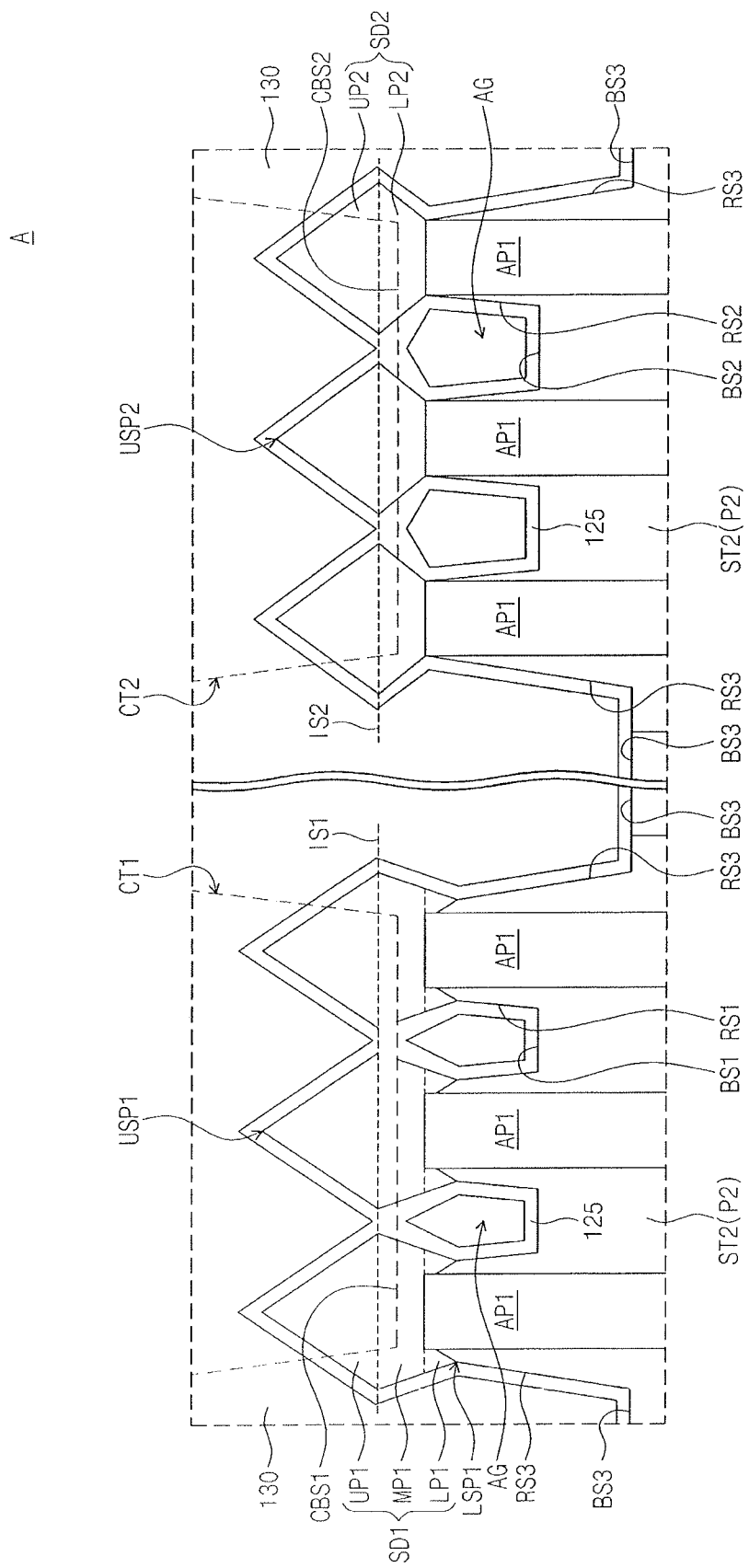
Figure 4A:
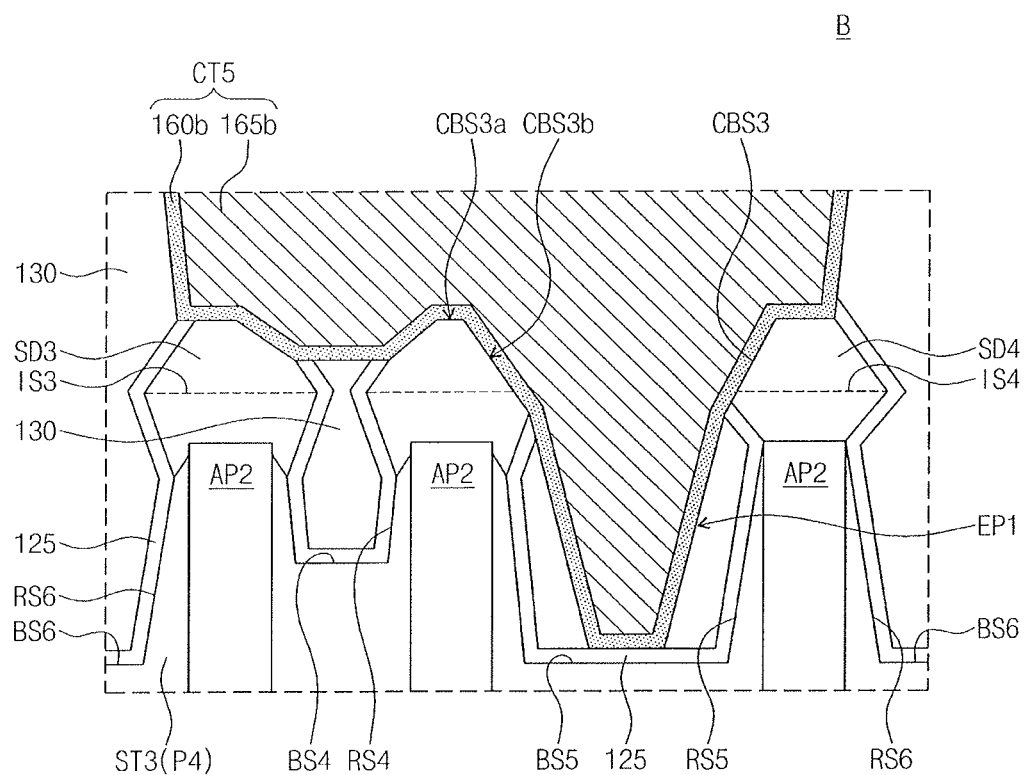
FIGS. 4A, 4B, and 4C illustrate enlarged views corresponding to a portion 'B' of FIG. 2C.
Figure 4B:
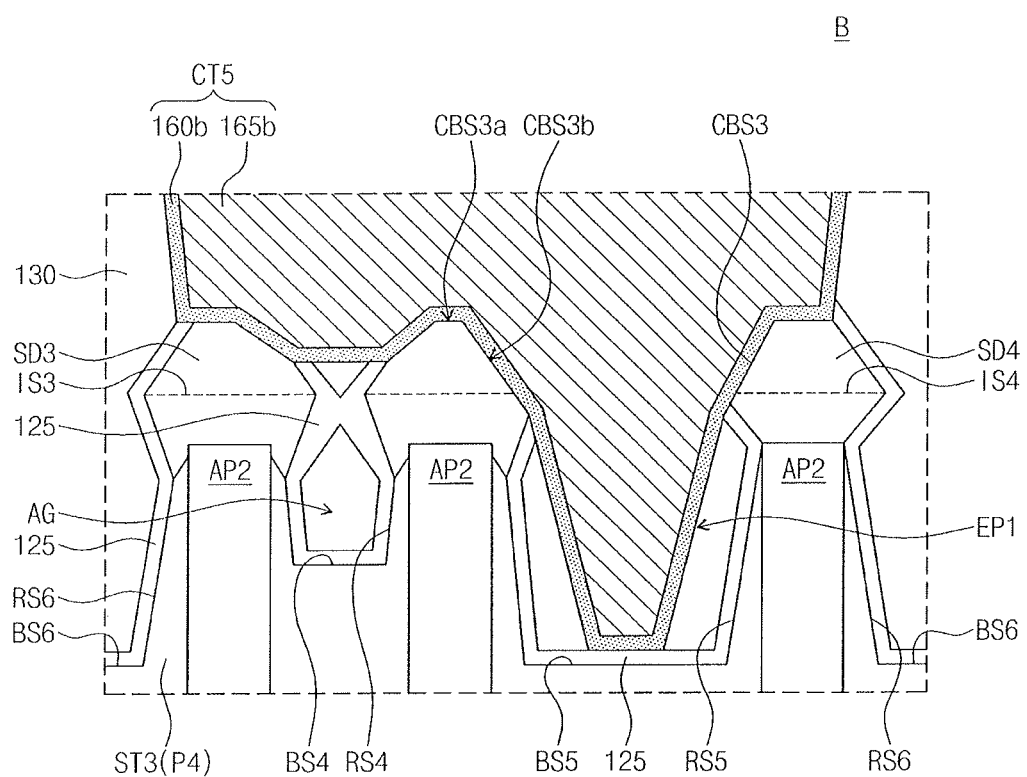
Figure 4C:
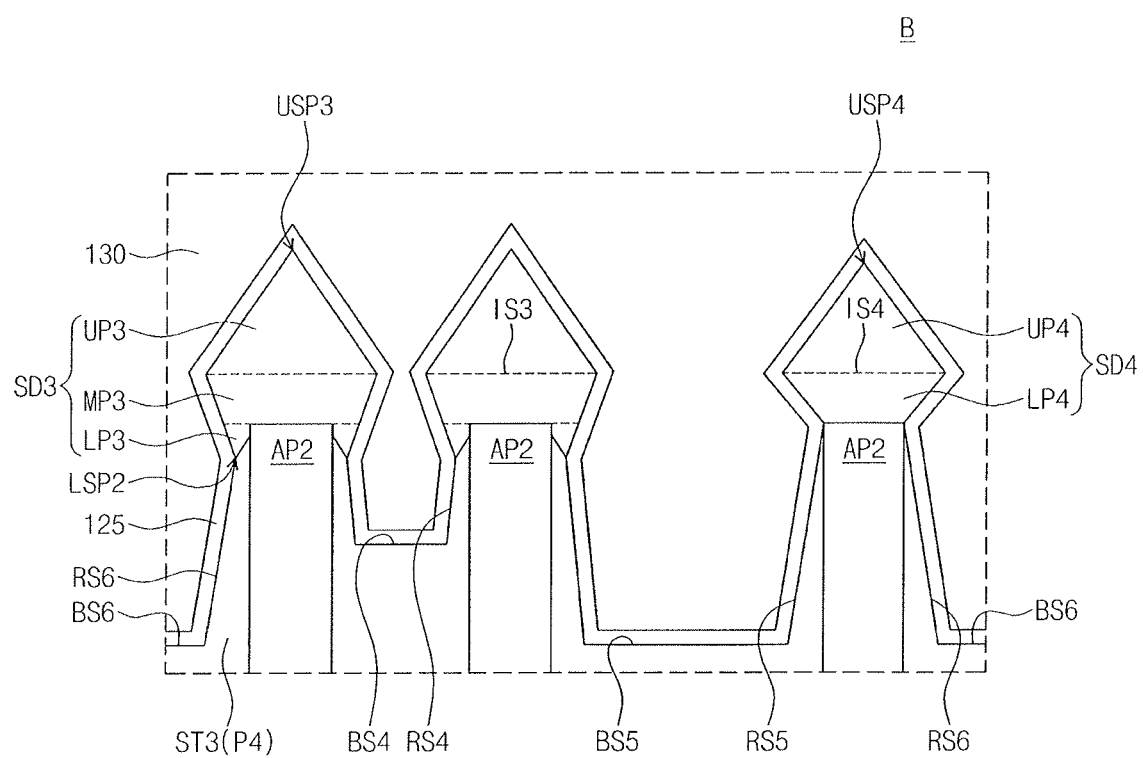

Referring to FIG. 3D, each of the first source/drain regions SD1 may include a first portion LP1 disposed on opposite sidewalls of the first active pattern AP1 disposed thereunder, a second portion MP1 having a width substantially increasing as a distance from the substrate 100 increases, and a third portion UP1 having a width substantially decreasing as a distance from the substrate 100 increases. The first portion LP1 may be disposed at a lower level than a top surface of the first active pattern AP1 disposed under the first source/drain region SD1, and may be in contact with the sidewalls of the first active pattern AP1 exposed by the second portions P2 of the second device isolation patterns ST2. In addition, a lowermost end LSP1 of the first portion LP1 may be spaced apart from the above mentioned sidewalls of the first active patterns AP1. The second and third portions MP1 and UP1 may be disposed at a higher level than the top surface of the first active pattern AP1. Here, an interface between the second and third portions MP1 and UP1 may be defined as a first interface IS1.

As further illustrated in FIG. 3D, each of the second source/drain regions SD2 may include a first portion LP2 being in contact with the top surface of the first active pattern AP1 disposed thereunder and having a width substantially increasing as a distance from the substrate 100 increases, and a second portion UP2 extending from the first portion LP2 and having a width substantially decreasing as a distance from the substrate 100 increases. Here, an interface between the first and second portions LP2 and UP2 of the second source/drain region SD2 may be defined as a second interface IS2. In some embodiments, uppermost ends USP1 of the first source/drain regions SD1 may be higher than uppermost ends USP2 of the second source/drain regions SD2.

As illustrated in FIG. 4C, the shapes of the third and fourth source/drain regions SD3 and SD4 may correspond to the shapes of the first and second source/drain regions SD1 and SD2, respectively. In detail, each of the third source/drain regions SD3 may include a first portion LP3 disposed on opposite sidewalls of the second active pattern AP2 disposed thereunder, a second portion MP3 having a width substantially increasing as a distance from the substrate 100 increases, and a third portion UP3 having a width substantially decreasing as a distance from the substrate 100 increases. At this time, the first portion LP3 may be disposed at a lower level than a top surface of the second active pattern AP2 disposed under the third source/drain region SD3 and may be in contact with the sidewalls of the second active pattern AP2 exposed by the fourth portions P4 of the third device isolation patterns ST3. In addition, a lowermost end of the first portion LP3 may be spaced apart from the above mentioned sidewalls of the second active pattern AP2. The second and third portions MP3 and UP3 may be disposed at a higher level than the top surface of the second active pattern AP2. An interface between the second and third portions MP3 and UP3 may be defined as a third interface IS3. Further, each of the fourth source/drain regions SD4 may include a first portion LP4 being in contact with the top surface of the second active pattern AP2 disposed thereunder and having a width substantially increasing as a distance from the substrate 100 increases, and a second portion UP4 extending from the first portion LP4 and having a width substantially decreasing as a distance from the substrate 100 increases. Here, an interface between the first and second portions LP4 and UP4 of the fourth source/drain region SD4 may be defined as a fourth interface 154. In some embodiments, uppermost ends USP3 of the third source/drain regions SD3 may be higher than uppermost ends USP4 of the fourth source/drain regions SD4.

The first gate electrode GE1, the first gate dielectric pattern GD1, and the first source/drain regions SD1, which are disposed on the NMOSFET region NR1 of the first region R1, may constitute a first transistor TR1 of an N-type. In other words, the first transistor TR1 may be realized as an N-type multi-fin field effect transistor. Thus, an on-current characteristic of the first transistor TR1 may be improved. The first gate electrode GE1, the first gate dielectric pattern GD1, and the second source/drain regions SD2, which are disposed on the PMOSFET region PR1 of the first region R1, may constitute a second transistor TR2 of a P-type. In other words, the second transistor TR2 may be realized as a P-type multi-fin field effect transistor. Thus, an on-current characteristic of the second transistor TR2 may be improved.

The second gate electrode GE2, the second gate dielectric pattern GD2, and the third source/drain regions SD3, which are disposed on the NMOSFET region NR2 of the second region R2, may constitute a third transistor TR3 of an N-type. In other words, the third transistor TR3 may be realized as an N-type multi-fin field effect transistor. Thus, an on-current characteristic of the third transistor TR3 may be improved. The second gate electrode GE2, the second gate dielectric pattern GD2, and the fourth source/drain regions SD4, which are disposed on the PMOSFET region PR2 of the second region R2, may constitute a fourth transistor TR4 of a P-type. In other words, the fourth transistor TR4 may be realized as a P-type single-fin field effect transistor.

Referring back to FIGS. 1, 2A, 2B, 2C, 3A, and 4A, a contact etch stop layer 125 may be disposed on the substrate 100. The contact etch stop layer 125 may cover inner surfaces of the recess regions (e.g., the first to sixth recess regions RS1 to RS6) of the first to third device isolation patterns ST1, ST2, and ST3 and may extend onto the source/drain regions SD1 to SD4 and both sidewalls of each of the gate structures GS1 and GS2. The contact etch stop layer 125 may include a material having an etch selectivity with respect to a first interlayer insulating layer 130 to be described later. For example, the contact etch stop layer 125 may include a silicon nitride layer and/or a silicon oxynitride layer.

The first interlayer insulating layer 130 may be disposed on the substrate 100 to cover the source/drain regions SD1 to SD4 and the both sidewalls of the gate structures GS1 and GS2. A top surface 130S1 of the first interlayer insulating layer 130 of the first region R1 may be substantially coplanar with the top surface GE1S of the first gate electrode GE1, and a top surface 130S2 of the first interlayer insulating layer 130 of the second region R2 may be substantially coplanar with the top surface GE2S of the second gate electrode GE2. In other words, the top surface 130S1 of the first interlayer insulating layer 130 of the first region R1 may be lower than the top surface 130S2 of the first interlayer insulating layer 130 of the second region R2. In some embodiments, the first interlayer insulating layer 130 of the first region R1 may fully fill only a portion of the recess regions (e.g., the first to third recess regions RS1 to RS3), in which the contact etch stop layer 125 is formed, of the first region R1.

For example, the first and second recess regions RS1 and RS2 may not be fully filled with the first interlayer insulating layer 130. In other words, air gaps AG may be formed in the first and second recess regions RS1 and RS2 (FIGS. 2C and 3A). The air gap AG may be a substantially empty space which is not provided with a solid material. Since the space between the first active patterns AP1 is narrow, portions of the contact etch stop layer 125 disposed on the sidewalls of the adjacent source/drain regions SD1 or SD2 may be connected to each other to form the air gap AG in each of the first and second recess regions RS1 and RS2. In other words, the air gap AG may be defined by the contact etch stop layer 125 covering the inner surface of each of the first and second recess regions RS1 and RS2. Since the air gaps AG are formed in the first and second recess regions RS1 and RS2, parasitic capacitances between the first active patterns AP1 may be reduced.

According to some embodiments, the first interlayer insulating layer 130 of the second region R2 may fully fill the recess regions (e.g., the fourth to sixth recess regions RS4 to RS6) of the second region R2 in which the contact etch stop layer 125 is formed. Since the second distance d2 between the second active patterns AP2 is smaller than the third distance d3 but is greater than the first distance d1 between the first active patterns AP1, the first interlayer insulating layer 130 may fully fill the fourth recess region R4 having a narrow width. According to other embodiments, a portion of the recess regions of the second region R2 may not be fully filled with the first interlayer insulating layer 130. As illustrated in FIG. 4B, the fourth recess region R4 may not be fully filled with the first interlayer insulating layer 130. In other words, an air gap AG may be formed in the fourth recess region RS4. In this case, a parasitic capacitance between the second active patterns AP2 of the NMOSFET region NR2 may be reduced. For example, the first interlayer insulating layer 130 may include at least one of a silicon oxide layer or low-k dielectric layers.

A second interlayer insulating layer 150 may be disposed on the substrate 100. The second interlayer insulating layer 150 may cover the first interlayer insulating layer 130 and the gate structures GS1 and GS2. According to embodiments, a top surface 150S1 of the second interlayer insulating layer 150 of the first region R1 may be lower than a top surface 150S2 of the second interlayer insulating layer 150 of the second region R2. The second interlayer insulating layer 150 may include at least one of, e.g., a silicon oxide layer, a silicon nitride layer, a silicon oxynitride layer, or low-k dielectric layers. In some embodiments, a gate capping layer 145 may be disposed between the second interlayer insulating layer 150 and the gate structures GS1 and GS2 and between the second interlayer insulating layer 150 and the first interlayer insulating layer 130. In more detail, the gate capping layer 145 of the first region R1 may cover the top surface GE1S of the first gate electrode GE1 and may extend onto the top surface 130S1 of the first interlayer insulating layer 130 of the first region R1. The gate capping layer 145 of the second region R2 may cover the top surface GE2S of the second gate electrode GE2 and may extend onto the top surface 130S2 of the first interlayer insulating layer 130 of the second region R2. In other embodiments, unlike the drawings, the gate capping layer 145 may be locally disposed on each of the top surfaces GE1S and GE2S of the gate electrodes GE1 and GE2 and may not cover the top surfaces 130S1 and 130S2 of the first interlayer insulating layer 130. In still other embodiments, the gate capping layer 145 may be omitted. The gate capping layer 145 may include, e.g., a silicon nitride layer.

Source/drain contacts may be disposed at both sides of each of the gate structures GS1 and GS2. The source/drain contacts may penetrate the second interlayer insulating layer 150, the gate capping layer 145, the first interlayer insulating layer 130, and the contact etch stop layer 125 so as to be connected to the source/drain regions. In more detail, the source/drain contacts of the first region R1 may include first source/drain contacts CT1 disposed at both sides of the first gate structure GS1 of the NMOSFET region NR1, and second source/drain contacts CT2 disposed at both sides of the first gate structure GS1 of the PMOSFET region PR1 (FIG. 2A). Each of the first source/drain contacts CT1 may be connected in common to the first source/drain regions SD1 disposed at each side of the first gate structure GS1. Each of the second source/drain contacts CT2 may be connected in common to the second source/drain regions SD2 disposed at each side of the first gate structure GS1. In a plan view, the first source/drain contacts CT1 may intersect the first active patterns AP1 of the NMOSFET region NR1 and the second source/drain contacts CT2 may intersect the first active patterns AP1 of the PMOSFET region PR1 (FIG. 1).

Each of the first and second source/drain contacts CT1 and CT2 may include a first conductive pattern 160a and a second conductive pattern 165a disposed on the first conductive pattern 160a. The first conductive pattern 160a may include a barrier conductive layer. For example, the first conductive pattern 160a may include at least one of a titanium nitride layer, a tungsten nitride layer, or a tantalum nitride layer. The second conductive pattern 165a may include a metal layer. For example, the second conductive pattern 165a may include at least one of tungsten, titanium, or tantalum. In other embodiments, the first and second source/drain contacts CT1 and CT2 may include a doped semiconductor material. Even though not shown in the drawings, each of the first and second source/drain contacts CT1 and CT2 may further include a metal silicide layer disposed between the first conductive pattern 160a and each of the source/drain regions SD1 and SD2. The metal silicide layer may include at least one of, e.g., titanium silicide, tantalum silicide, or tungsten silicide.

The source/drain contacts of the second region R2 may include third and fourth source/drain contacts CT3 and CT4 disposed at one side of the second gate structure GS2, and a fifth source/drain contact CT5 disposed at another side of the second gate structure GS2. The third source/drain contact CT3 may be connected in common to the third source/drain regions SD3 disposed at the one side of the second gate structure GS2, and the fourth source/drain contact CT4 may be connected to the fourth source/drain region SD4 disposed at the one side of the second gate structure GS2. The fifth source/drain contact CT5 may be connected in common to the third and fourth source/drain regions SD3 and SD4 disposed at the another side of the second gate structure GS2. In a plan view, the third source/drain contact CT3 may intersect the second active patterns AP2 of the NMOSFET region NR2, and the fourth source/drain contact CT4 may intersect the second active pattern AP2 of the PMOSFET region PR2. The fifth source/drain contact CT5 may intersect the second active patterns AP2 of the NMOSFET and PMOSFET regions NR2 and PR2 when viewed from a plan view.

Each of the third to fifth source/drain contacts CT3, CT4, and CT5 may include a first conductive pattern 160b and a second conductive pattern 165b disposed on the first conductive pattern 160b. The first conductive pattern 160b may include a barrier conductive layer. For example, the first conductive pattern 160b may include at least one of a titanium nitride layer, a tungsten nitride layer, or a tantalum nitride layer. The second conductive pattern 165b may include a metal layer. For example, the second conductive pattern 165b may include at least one of tungsten, titanium, or tantalum. In other embodiments, the third to fifth source/drain contacts CT3 to CT5 may include a doped semiconductor material. Even though not shown in the drawings, each of the third to fifth source/drain contacts CT3 to CT5 may further include a metal silicide layer disposed between the first conductive pattern 160b and each of the source/drain regions SD3 and SD4. For example, the metal silicide layer may include at least one of titanium silicide, tantalum silicide, or tungsten silicide.

The first and second source/drain contacts CT1 and CT2 may be formed at the same time to have top surfaces US1 and US2 disposed at the substantially same height. Likewise, the third to fifth source/drain contacts CT3 to CT5 may be formed at the same time to have top surfaces US3 to US5 disposed at the substantially same height. At this time, the top surfaces US3 to US5 of the third to fifth source/drain contacts CT3 to CT5 may be higher than the top surfaces US1 to US2 of the first and second source/drain contacts CT1 and CT2. A profile of bottom surfaces of the first to fifth source/drain contacts CT1 to CT5 may be variously realized. Hereinafter, the shapes of the first, second, and fifth source/drain contacts CT1, CT2, and CT5 will be described in more detail with reference to some drawings.

First, the shapes of the first and second source/drain contacts CT1 and CT2 will be described with reference to FIGS. 3A, 3B, and 3C. Referring to FIG. 3A, a bottom surface CBS1 of the first source/drain contact CT1 may be lower, e.g., relative to the bottom of the substrate 100, than the first interfaces IS1 of the first source/drain regions SD1 and higher, e.g., relative to the bottom of the substrate 100, than the top surfaces of the first active patterns AP1 which are in contact with the first source/drain regions SD1. Likewise, a bottom surface CBS2 of the second source/drain contact CT2 may be lower than the second interfaces IS2 of the second source/drain regions SD2 and higher than the top surfaces of the first active patterns AP1 which are in contact with the second source/drain regions SD2. In some embodiments, the bottom surfaces CBS1 and CBS2 of the first and second source/drain contacts CT1 and CT2 may have flat surfaces that are substantially parallel to the top surface of the substrate 100. In other embodiments, the bottom surfaces CBS1 and CBS2 of the first and second source/drain contacts CT1 and CT2 may have uneven and curved surfaces, as illustrated in FIG. 3B. In this case, an uppermost portion of the bottom surface CBS1 of the first source/drain contact CT1 may be lower than the first interfaces IS1 of the first source/drain regions SD1, and a lowermost portion of the bottom surface CBS1 of the first source/drain contact CT1 may be higher than the top surfaces of the first active patterns AP1 which are in contact with the first source/drain regions SD1. Likewise, an uppermost portion of the bottom surface CBS2 of the second source/drain contact CT2 may be lower than the second interfaces IS2 of the second source/drain regions SD2, and a lowermost portion of the bottom surface CBS2 of the second source/drain contact CT2 may be higher than the top surfaces of the first active patterns AP1 which are in contact with the second source/drain regions SD2.

In still other embodiments, as illustrated in FIG. 3C, the first and second source/drain contacts CT1 and CT2 may include extensions EP2 that extend into the recess regions (e.g., the first and second recess regions RS1 and RS2) between the first active patterns AP1. In this case, an uppermost portion of the bottom surface CBS1 of the first source/drain contact CT1 may be lower than the first interfaces IS1 of the first source/drain regions SD1. However, a lowermost portion of the bottom surface CBS1 of the first source/drain contact CT1 may be lower than the top surfaces of the first active patterns AP1 which are in contact with the first source/drain regions SD1. In an embodiment, the lowermost portion of the bottom surface CBS1 of the first source/drain contact CT1 may be in contact with the contact etch stop layer 125 disposed on the bottom surface BS1 of the first recess region RS1. Likewise, an uppermost portion of the bottom surface CBS2 of the second source/drain contact CT2 may be lower than the second interfaces IS2 of the second source/drain regions SD2. However, a lowermost portion of the bottom surface CBS2 of the second source/drain contact CT2 may be lower than the top surfaces of the first active patterns AP1 which are in contact with the second source/drain regions SD2. In an embodiment, the lowermost portion of the bottom surface CBS2 of the second source/drain contact CT2 may be in contact with the contact etch stop layer 125 disposed on the bottom surface BS2 of the second recess region RS2.

Next, referring to FIG. 4A, a bottom surface CBS3 of the fifth source/drain contact CT5 may include a plurality of flat surfaces (e.g., first flat surfaces CBS3a parallel to the bottom of the substrate 100), and a plurality of inclined surfaces (e.g., first inclined surfaces CBS3b at an oblique angle with respect to the bottom of the substrate 100) that extend from the flat surfaces so as to be inclined downward. In this case, an uppermost one of the flat surfaces of the bottom surface CBS3 of the fifth source/drain contact CT5 may be higher than the third interfaces IS3 of the third source/drain regions SD3 and the fourth interfaces IS4 of the fourth source/drain regions SD4. On the other hand, one or some of the inclined surfaces of the bottom surface CBS3 of the fifth source/drain contact CT5 may extend to a lower level than the top surfaces of the second active patterns AP2 which are in contact with the third and fourth source/drain regions SD3 and SD4. In other words, the fifth source/drain contact CT5 may include an extension EP1 extending into the fifth recess region RS5. The extension EP1 of the fifth source/drain contact CT5 may be spaced apart from the second active patterns AP2 adjacent thereto. Alternatively, even though not shown in the drawings, the bottom surface CBS3 of the fifth source/drain contact CT5 may be uneven and curved. In this case, an uppermost portion of the bottom surface CBS3 of the fifth source/drain contact CT5 may be higher than the third and fourth interfaces IS3 and IS4. According to embodiments, the bottom surfaces CBS1 and CBS2 of the first and second source/drain contacts CT1 and CT2 may be lower than the uppermost portion (or the uppermost surface) of the bottom surface CBS3 of the fifth source/drain contact CT5. Since the fifth source/drain contact CT5 has the bottom surface CBS3 described above, a contact area between the fifth source/drain contact CT5 and the source/drain regions may increase. As a result, a contact resistance between the fifth source/drain contact CT5 and the source/drain regions may be reduced to improve electrical characteristics of the semiconductor device.

Interconnections may be disposed on the second interlayer insulating layer 150 so as to be connected to the first to fifth source/drain contacts CT1 to CT5, respectively. The interconnections may be electrically connected to the first to fourth source/drain regions SD1 to SD4 through the first to fifth source/drain contacts CT1 to CT5. The interconnections may include a conductive material.

Next, a method for manufacturing a semiconductor device according to example embodiments will be described with reference to FIGS. 5A to 10A, 5B to 10B, and 5C to 10C.

FIGS. 5A to 10A are cross-sectional views taken along lines I-I', A-A', and B-B' of FIG. 1 to illustrate a method for manufacturing a semiconductor device according to example embodiments. FIGS. 5B to 10B are cross-sectional views taken along lines and C-C' of FIG. 1. FIGS. 5C to 10C are cross-sectional views taken along lines IV-IV' and D-D' of FIG. 1.

Figure 5A:
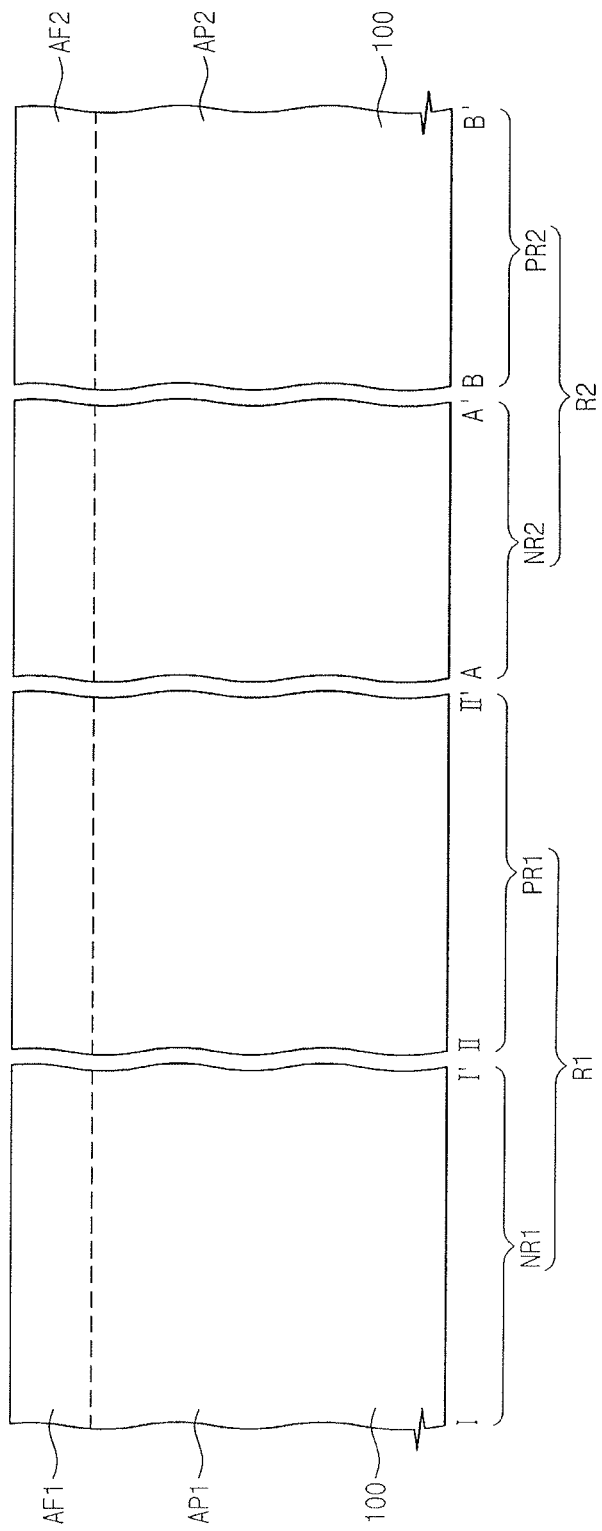
Figure 5B:
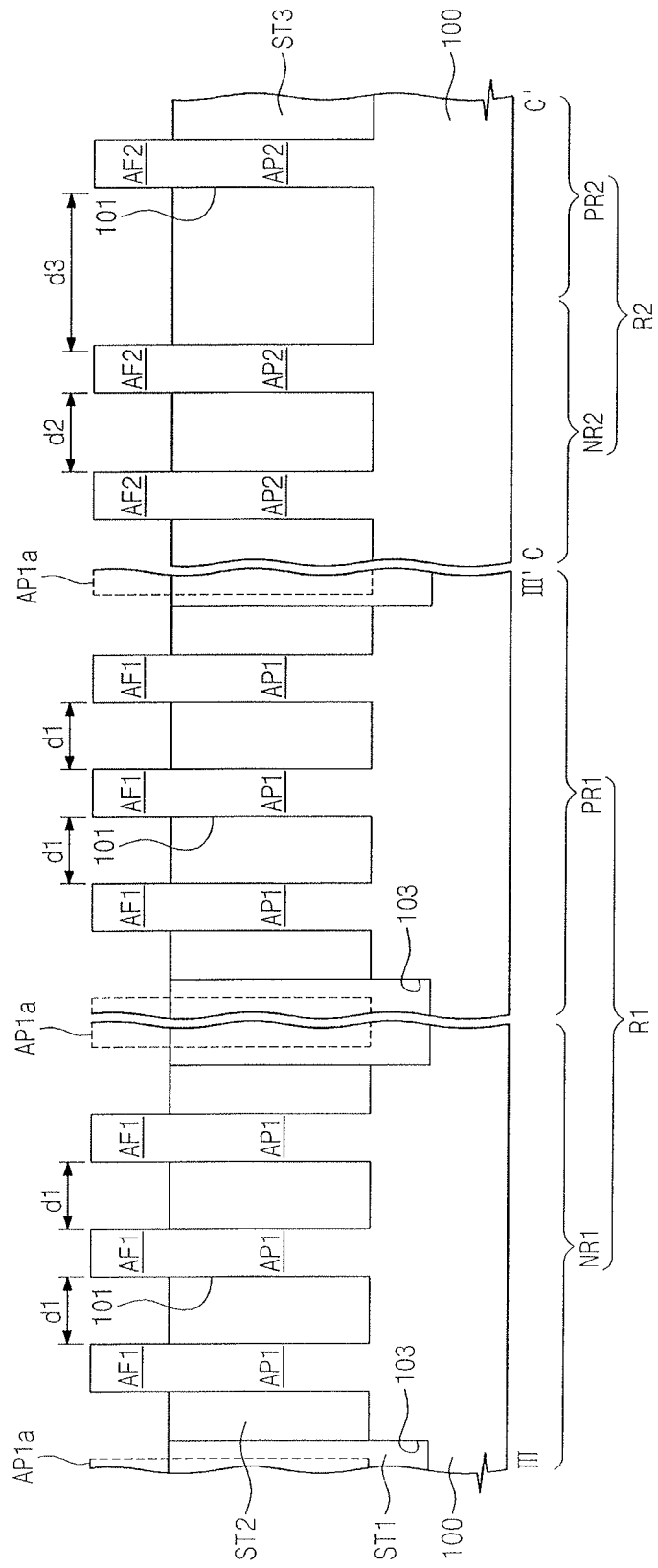
Figure 5C:
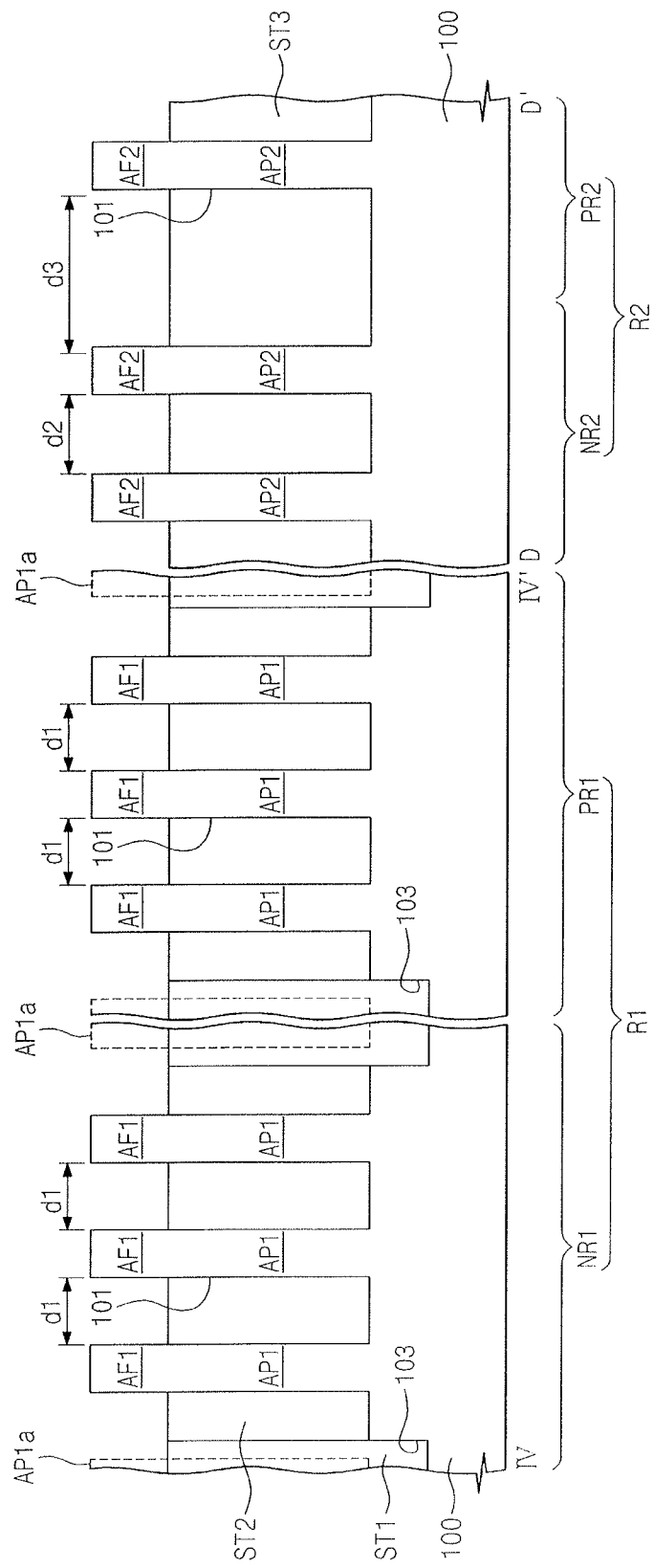

Referring to FIGS. 5A, 5B, and 5C, the substrate 100 including the first region R1 and the second region R2 may be provided. The substrate 100 may be a semiconductor substrate. For example, the substrate 100 may be a silicon substrate, a germanium substrate, or a 501 substrate. According to an embodiment, the first region R1 may be a portion of a logic cell region in which logic transistors constituting a logic circuit are disposed. For example, the first region R1 may be a region in which logic transistors constituting a process core or an I/O terminal are disposed. However, embodiments are not limited thereto. The second region R2 may be a portion of a memory cell region in which a plurality of memory cells for storing data are formed. For example, memory cell transistors constituting a plurality of 6T static random access memory (6T SRAM) cells may be formed in the second region R2. Each of the 6T SRAM cells may consist of six transistors. However, embodiments are not limited thereto.

Each of the regions R1 and R2 may include the NMOSFET region NR1 or NR2 and the PMOSFET region PR1 or PR2. In the present embodiment, the NMOSFET region NR1 or NR2 may be defined as an active region on which one N-type transistor is disposed, and the PMOSFET region PR1 or PR2 may be defined as an active region on which one P-type transistor is disposed. The NMOSFET region NR1 or NR2 and the PMOSFET region PR1 or PR2 of each of the regions R1 and R2 may be arranged in, for example, a first direction D1. However, embodiments are not limited thereto.

The substrate 100 may be patterned to form shallow trenches 101 defining first active patterns AP1 of the first region R1 and second active patterns AP2 of the second region R2. The first active patterns AP1 may be arranged in the first direction D1 and may have line shapes extending in a second direction D2 intersecting the first direction D1. Likewise, the second active patterns AP2 may be arranged in the first direction D1 and may have line shapes extending in the second direction D2. The first active patterns AP1 may be spaced apart from each other at substantially equal distances. For example, the first active patterns AP1 may be spaced apart from each other by the first distance d1. In another example, the second active patterns AP2 of the NMOSFET region NR2 may be spaced apart from each other by a second distance d2, and the second active pattern AP2 of the PMOSFET region PR2 may be spaced apart from the second active pattern AP2, adjacent to the PMOSFET region PR2, of the NMOSFET region NR2 by a third distance d3. The third distance d3 may be greater than the second distance d2. The third distance d3 may be a minimum distance necessary to isolate the NMOSFET region NR2 from the PMOSFET region PR2 having a different conductivity type from the NMOSFET region NR2. The second distance d2 may be greater than the first distance d1. A necessary first active pattern AP1a disposed between the NMOSFET and PMOSFET regions NR1 and PR1 may be removed.

A deep trench 103 may be formed between the NMOSFET and PMOSFET regions NR1 and PR1 during the removal of the necessary first active pattern AP1a. A bottom surface of the deep trench 103 may be lower or deeper than a bottom surface of the shallow trench 101.

A first device isolation pattern ST1 may be formed in the deep trench 103. In addition, second device isolation patterns ST2 may be formed in the shallow trenches 101 of the first region R1, and third device isolation patterns ST3 may be formed in the shallow trenches 101 of the second region R2. The second and third device isolation patterns ST2 and ST3 may be formed to expose upper portions of the first active patterns AP1 and upper portions of the second active patterns AP2, respectively. The upper portions of the first and second active patterns AP1 and AP2, which are exposed by the second and third device isolation patterns ST2 and ST3, may be defined as first and second active fins AF1 and AF2, respectively. A top surface of the first device isolation pattern ST1 may be substantially coplanar with a top surface of the second device isolation pattern ST2.

Figure 6A:
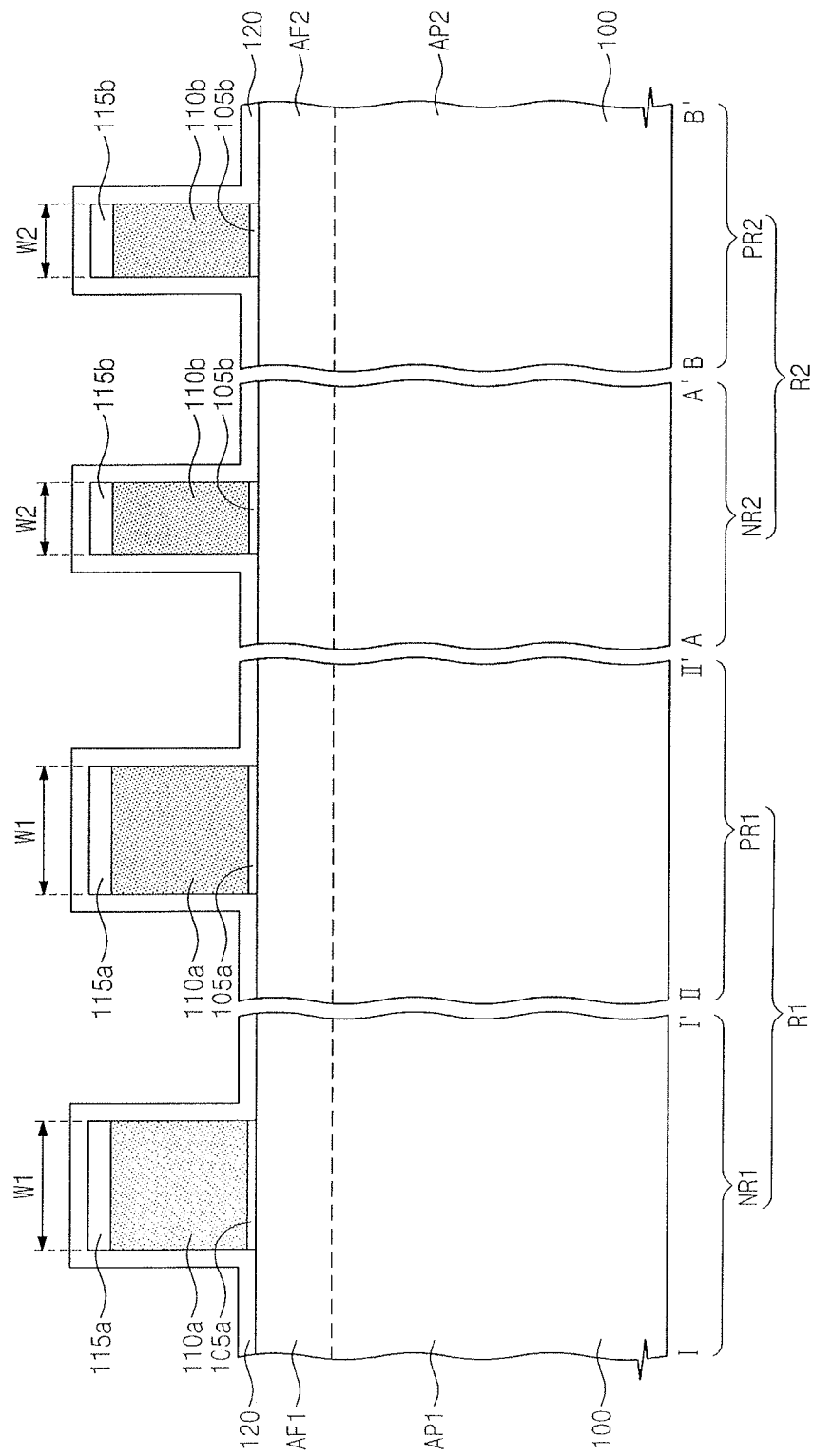
Figure 6B:
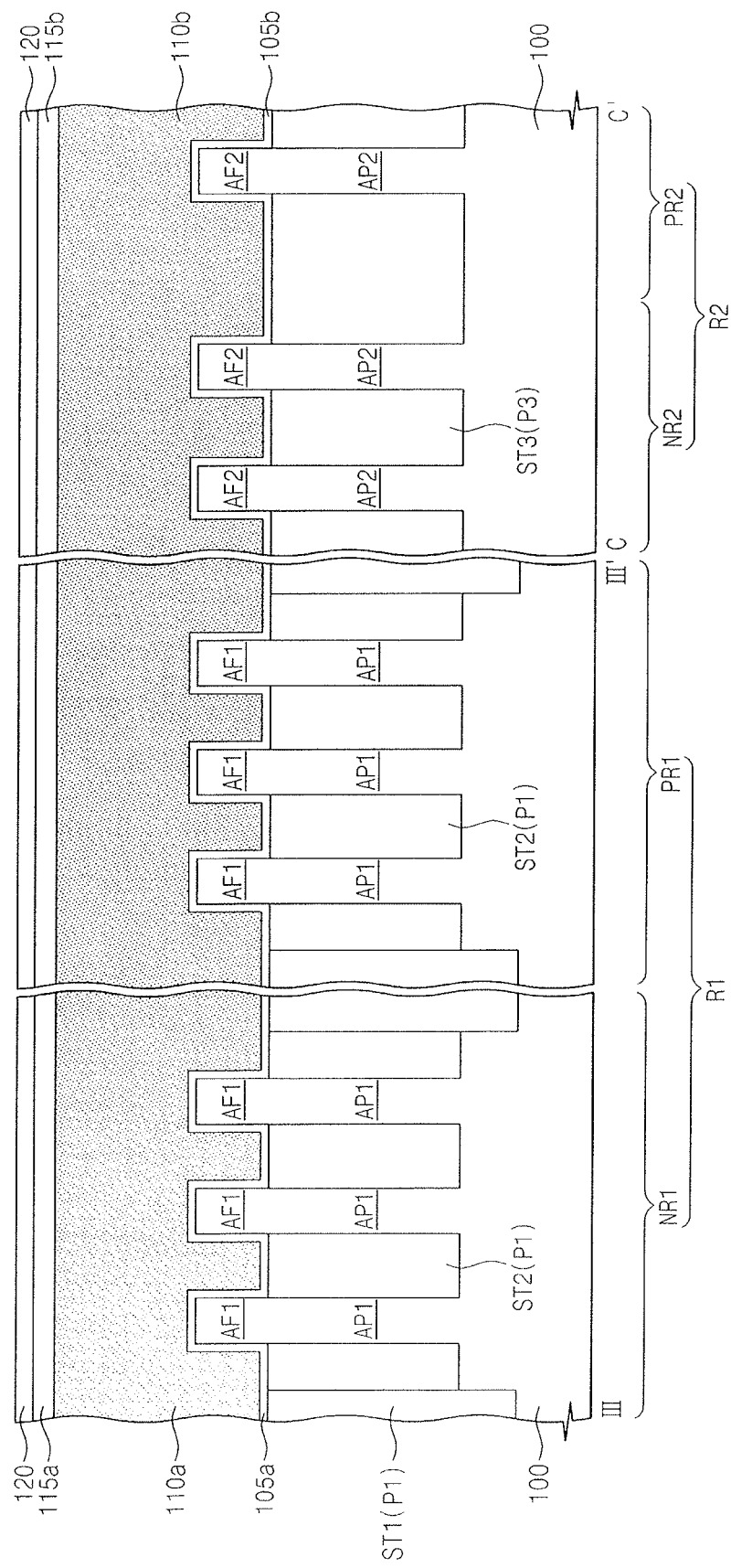
Figure 6C:
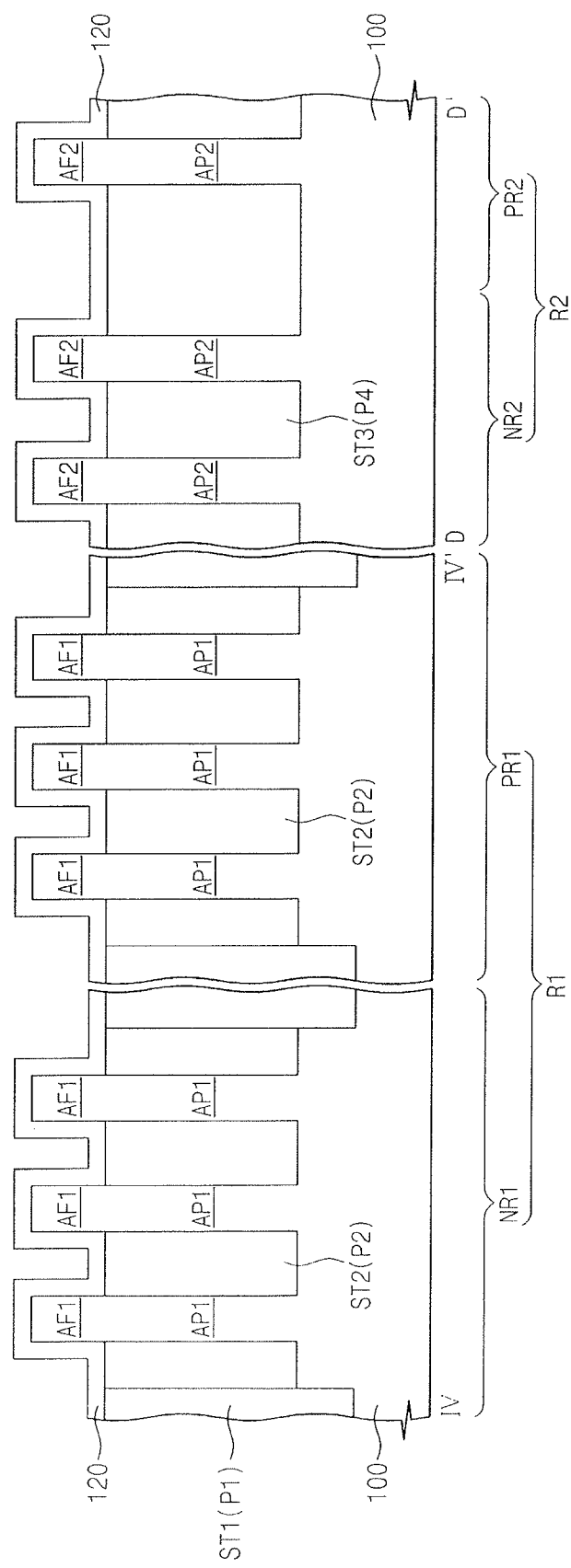

Referring to FIGS. 6A, 6B, and 6C, a first sacrificial gate structure may be formed on the substrate 100 of the first region R1. The first sacrificial gate structure may include a first etch stop pattern 105a, a first sacrificial gate pattern 110a, and a first gate mask pattern 115a which are sequentially stacked. In addition, a second sacrificial gate structure may be formed on the substrate 100 of the second region R2. The second sacrificial gate structure may include a second etch stop pattern 105b, a second sacrificial gate pattern 110b, and a second gate mask pattern 115b which are sequentially stacked. The first sacrificial gate structure may intersect the first active fins AF1, and the second sacrificial gate structure may intersect the second active fins AF2. In other words, the first etch stop pattern 105a and the first sacrificial gate pattern 110a may cover top surfaces and sidewalls of the first active fins AF1 and may extend onto top surfaces of the first and second device isolation patterns ST1 and ST2. The first gate mask pattern 115a may be disposed on a top surface of the first sacrificial gate pattern 110a to extend along the top surface of the first sacrificial gate pattern 110a. The second etch stop pattern 105b and the second sacrificial gate pattern 110b may cover top surfaces and sidewalls of the second active fins AF2 and may extend onto top surfaces of the third device isolation patterns ST3. The second gate mask pattern 115b may be disposed on a top surface of the second sacrificial gate pattern 110b to extend along the top surface of the second sacrificial gate pattern 110b.

According to embodiments, the first sacrificial gate pattern 110a may have a first width W1, and the second sacrificial gate pattern 110b may have a second width W2 smaller than the first width W1. In some embodiments, an etch stop layer, a sacrificial gate layer, and a gate mask layer may be sequentially formed on the substrate 100 to cover the first and second active fins AF1 and AF2, and the gate mask layer, the sacrificial gate layer, and the etch stop layer may be patterned to form the first and second sacrificial gate structures. The etch sop layer may include, e.g., silicon oxide. The sacrificial gate layer may include a material having an etch selectivity with respect to the etch stop layer. For example, the sacrificial gate layer may include polysilicon. The sacrificial layer may be formed by a chemical vapor deposition (CVD) process, a physical vapor deposition (PVD), or an atomic layer deposition (ALD) process. The gate mask layer may include a silicon nitride layer and/or a silicon oxynitride layer.

The first sacrificial gate pattern 110a may intersect the first active fins AF1 to define a first portion P1 and second portions P2 of each of the first and second device isolation patterns ST1 and ST2. The first portion P1 may correspond to a portion of each of the first and second device isolation patterns ST1 and ST2, which is disposed under the first sacrificial gate pattern 110a and overlaps with the first sacrificial gate pattern 110a. The second portions P2 may correspond to other portions of each of the first and second device isolation patterns ST1 and ST2, which are disposed at both sides of the first sacrificial gate pattern 110a and are laterally separated from each other by the first portion P1. Likewise, the second sacrificial gate pattern 110b may intersect the second active fins AF2 to define a third portion P3 and fourth portions P4 of each of the third device isolation patterns ST3. The third portion P3 may correspond to a portion of each of the third device isolation patterns ST3, which is disposed under the second sacrificial gate pattern 110b and overlaps with the second sacrificial gate pattern 110b. The fourth portions P4 may correspond to other portions of each of the third device isolation patterns ST3, which are disposed at both sides of the second sacrificial gate pattern 110b and are laterally separated from each other by the third portion P3.

Next, a gate spacer layer 120 may be formed on the substrate 100. The gate spacer layer 120 may conformally cover the first and second sacrificial gate patterns 110a and 110b. For example, the gate spacer layer 120 may include silicon nitride. Alternatively, the gate spacer layer 120 may include a low-k nitride such as silicon carbonitride (SiCN) or silicon oxy-carbonitride (SiOCN). The gate spacer layer 120 may be formed by a deposition process such as a CVD process or an ALD process.

Figure 7B:
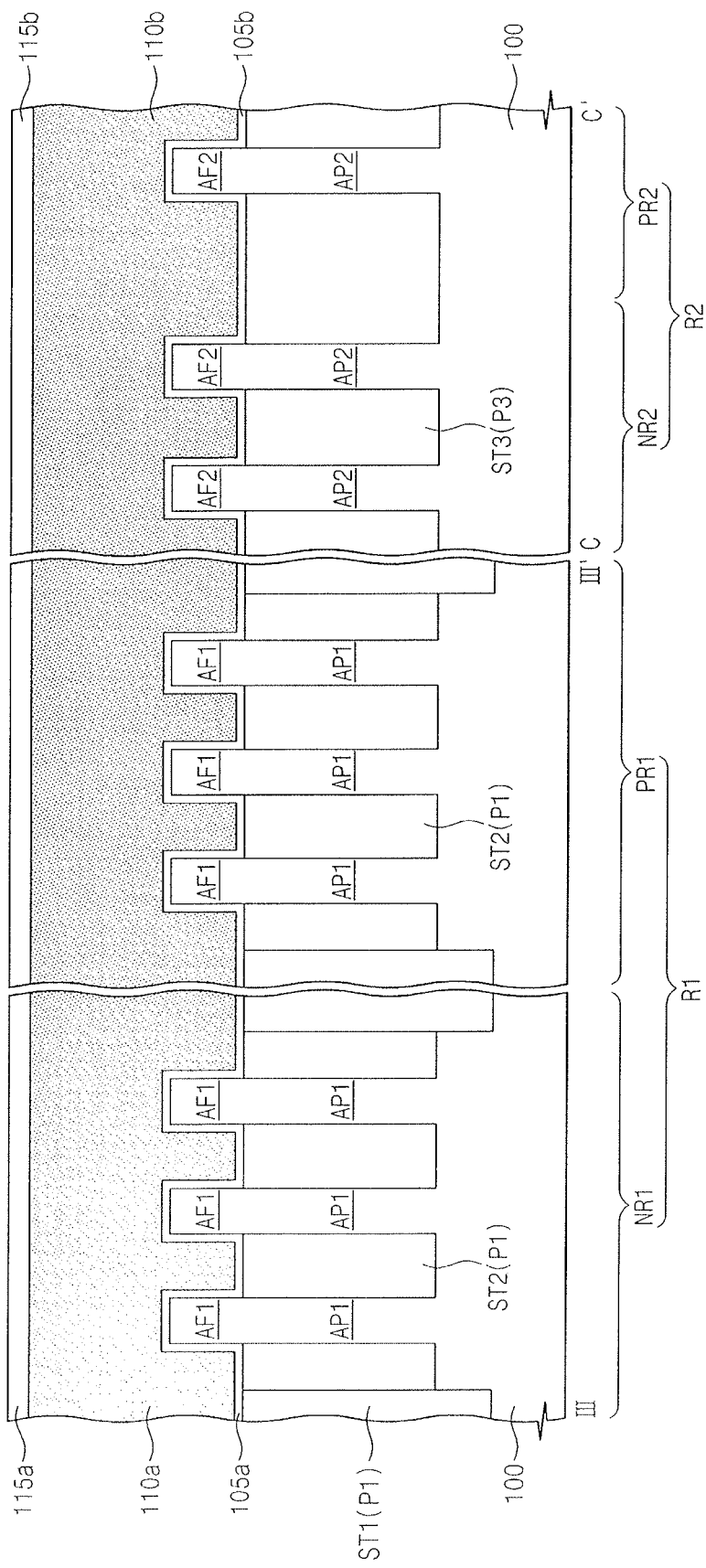
Figure 7C:
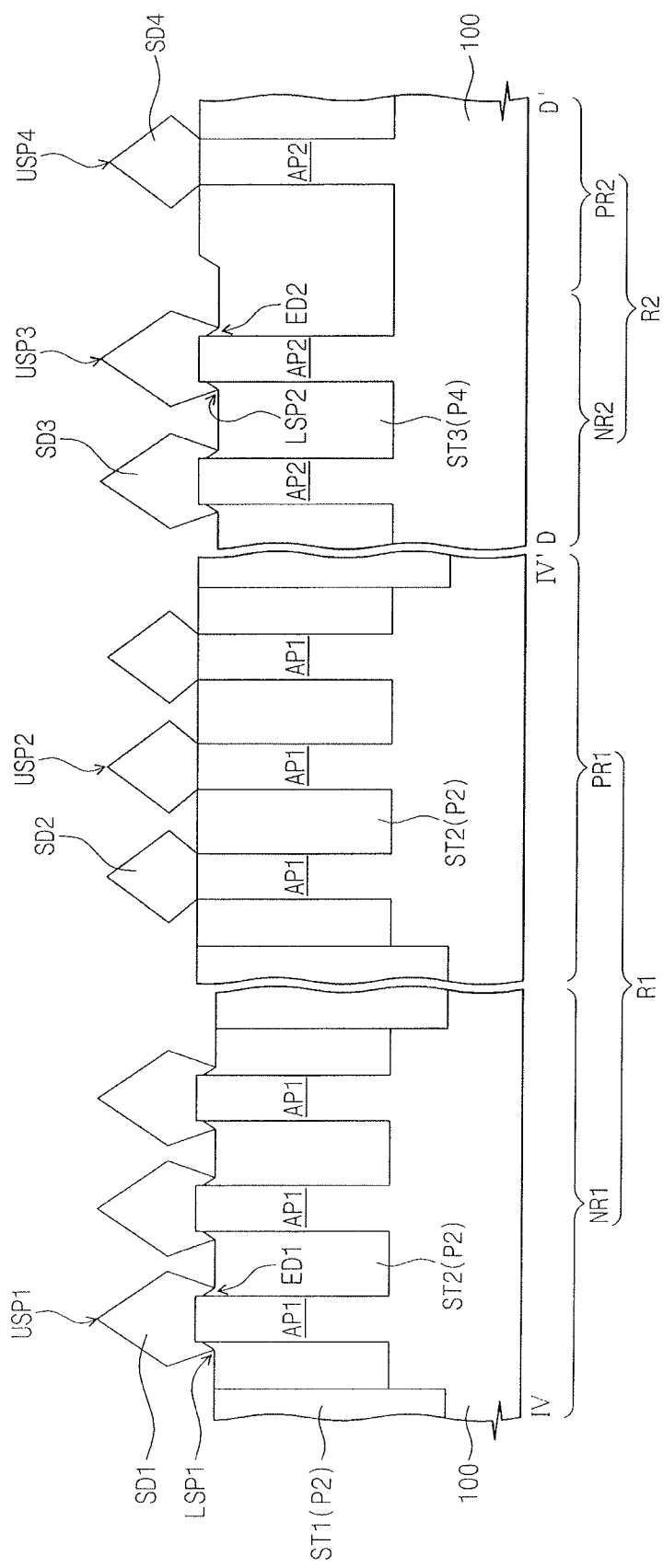

Referring to FIGS. 7A, 7B, and 7C, upper portions of the first active patterns AP1 at both sides of the first sacrificial gate pattern 110a and upper portions of the second active patterns AP2 at both sides of the second sacrificial gate pattern 110b may be removed. Removing the upper portions of the first and second active patterns AP1 and AP2 may include forming a mask pattern on the substrate 100, and performing an etching process using the mask pattern as an etch mask. The etching process may include a drying etching process and/or a wet etching process. The gate spacer layer 120 may also be etched during the removal of the upper portions of the first and second active patterns AP1 and AP2, so first gate spacers 121a may be formed on both sidewalls of the first sacrificial gate pattern 110a and second gate spacers 121b may be formed on both sidewalls of the second sacrificial gate pattern 110b.

According to some embodiments, upper portions of the second portions P2 of the first and second device isolation patterns ST1 and ST2 of the NMOSFET region NR1 may be recessed during the removal of the upper portions of the first active patterns AP1., thereby exposing sidewalls of the first active patterns AP1 disposed at both sides of the first sacrificial gate pattern 110a of the NMOSFET region NR1. On the other hand, when the upper portions of the second device isolation patterns ST2 are recessed, portions of the second device isolation patterns ST2 may not be etched but may remain on the sidewalls of the first active patterns AP1 of the NMOSFET region NR1. The remaining portions of the second device isolation patterns ST2 may be defined as first edge portions ED1. Upper portions of the fourth portions P4 of the third device isolation patterns ST3 of the NMOSFET region NR2 may be recessed during the removal of the upper portions of the second active patterns AP2, thereby exposing sidewalls of the second active patterns AP2 disposed at both sides of the second sacrificial gate pattern 110b of the NMOSFET region NR2. On the other hand, when the upper portions of the third device isolation patterns ST3 are recessed, portions of the third device isolation patterns ST3 may not be etched but may remain on the sidewalls of the second active patterns AP2 of the NMOSFET region NR2. The remaining portions of the third device isolation patterns ST3 may be defined as second edge portions ED2.

Next, first and second source/drain regions SD1 and SD2 may be formed at both sides of the first sacrificial gate pattern 110a, and third and fourth source/drain regions SD3 and SD4 may be formed at both sides of the second sacrificial gate pattern 110b. The first source/drain regions SD1 may be formed on the first active patterns AP1 of the NMOSFET region NR1, and the second source/drain regions SD2 may be formed on the first active patterns AP1 of the PMOSFET region PR1. The third source/drain regions SD3 may be formed on the second active patterns AP2 of the NMOSFET region NR2, and the fourth source/drain regions SD4 may be formed on the second active patterns AP2 of the PMOSFET region PR2. The first to fourth source/drain regions SD1 to SD4 may be formed by performing a selective epitaxial growth (SEG) process. In more detail, the first and third source/drain regions SD1 and SD3 may include epitaxial patterns grown using top surfaces and sidewalls of the active patterns AP1 and AP2 disposed thereunder as seeds. In this case, the first and second source/drain regions SD1 and SD3 may be formed of a material capable of providing a tensile strain to the first and second active fins AF1 and AF2 disposed therebetween. For example, if the substrate 100 is a silicon substrate, the first and second source/drain regions SD1 and SD3 may be formed of silicon (Si) or silicon carbide (SiC). However, embodiments are not limited thereto. The first and third source/drain regions SD1 and SD3 may be doped with dopants during or after the SEG process. The first and third source/drain regions SD1 and SD3 may be doped with N-type dopants.

On the other hand, the second and fourth source/drain regions SD2 and SD4 may include epitaxial patterns grown using top surfaces of the active patterns AP1 and AP2 disposed thereunder as seeds. In this case, the second and fourth source/drain regions SD2 and SD4 may be formed of a material capable of providing a compressive strain to the first and second active fins AF1 and AF2 disposed therebetween. For example, if the substrate 100 is a silicon substrate, the second and fourth source/drain regions SD2 and SD4 may be formed of silicon-germanium (SiGe). However, embodiments are not limited thereto. The second and fourth source/drain regions SD2 and SD4 may be doped with dopants during or after the SEG process. The second and fourth source/drain regions SD2 and SD4 may be doped with P-type dopants.

In some embodiments, uppermost ends USP1 of the first source/drain regions SD1 may be higher than uppermost ends USP2 of the second source/drain regions SD2. In addition, uppermost ends USP3 of the third source/drain regions SD3 may be higher than uppermost ends USP4 of the fourth source/drain regions SD4. These may be realized by adjusting growth rates of the first to fourth source/drain regions SD1 to SD4 during the SEG process. Meanwhile, since the edge portions ED1 and ED2 are formed, lowermost ends LSP1 and LSP2 of the first and third source/drain regions SD1 and SD3 may be spaced apart from the sidewalls of the first and second active patterns AP1 and AP2.

Figure 8A:
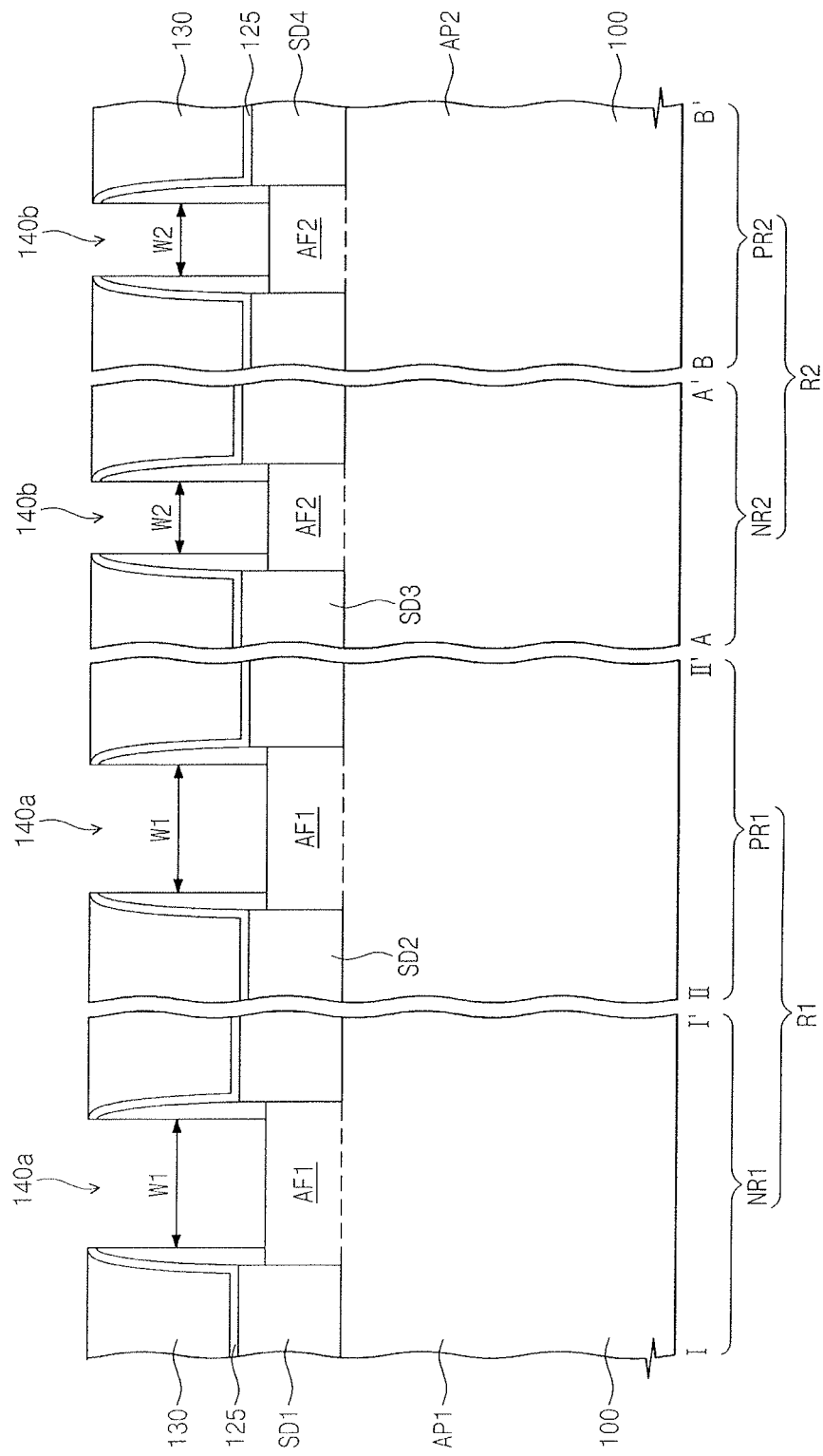
Figure 8B:
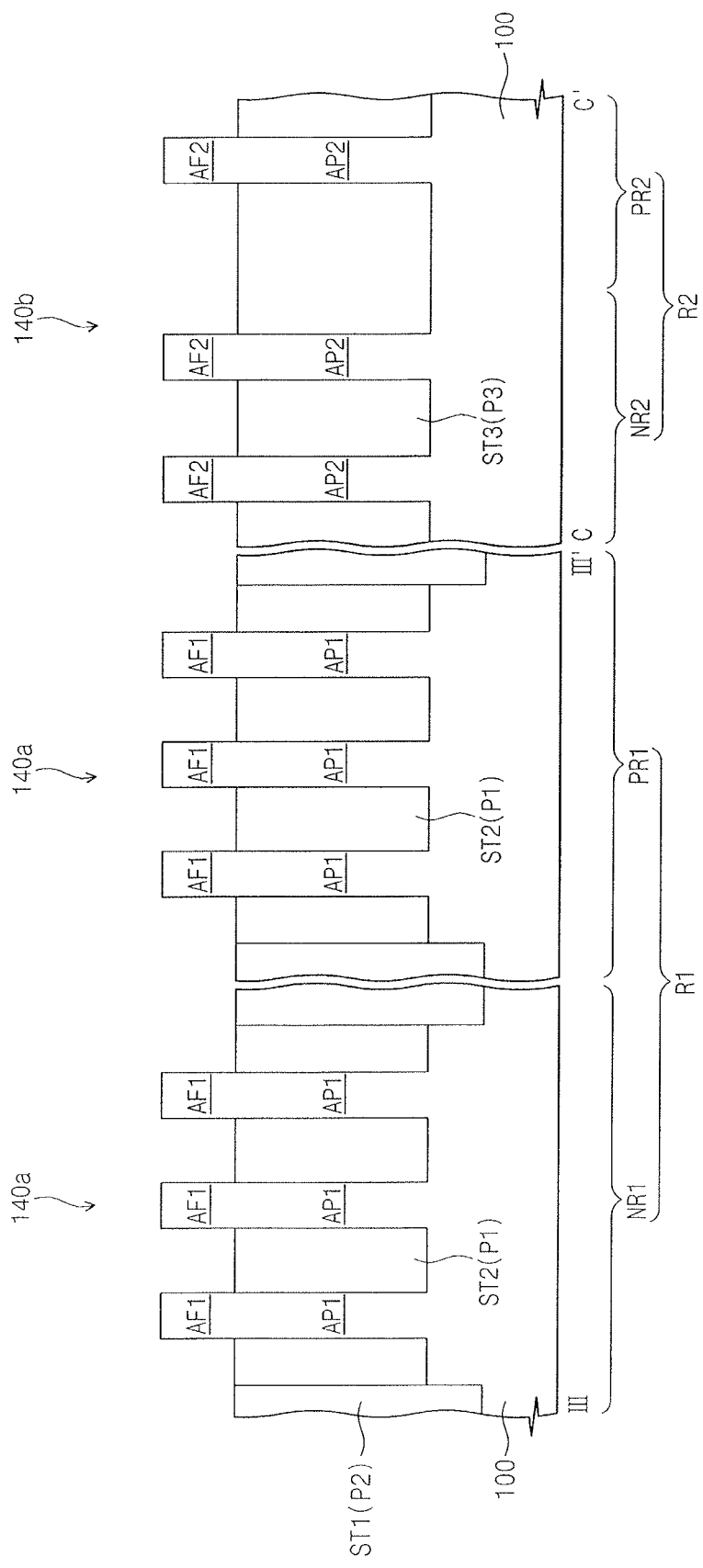
Figure 8C:
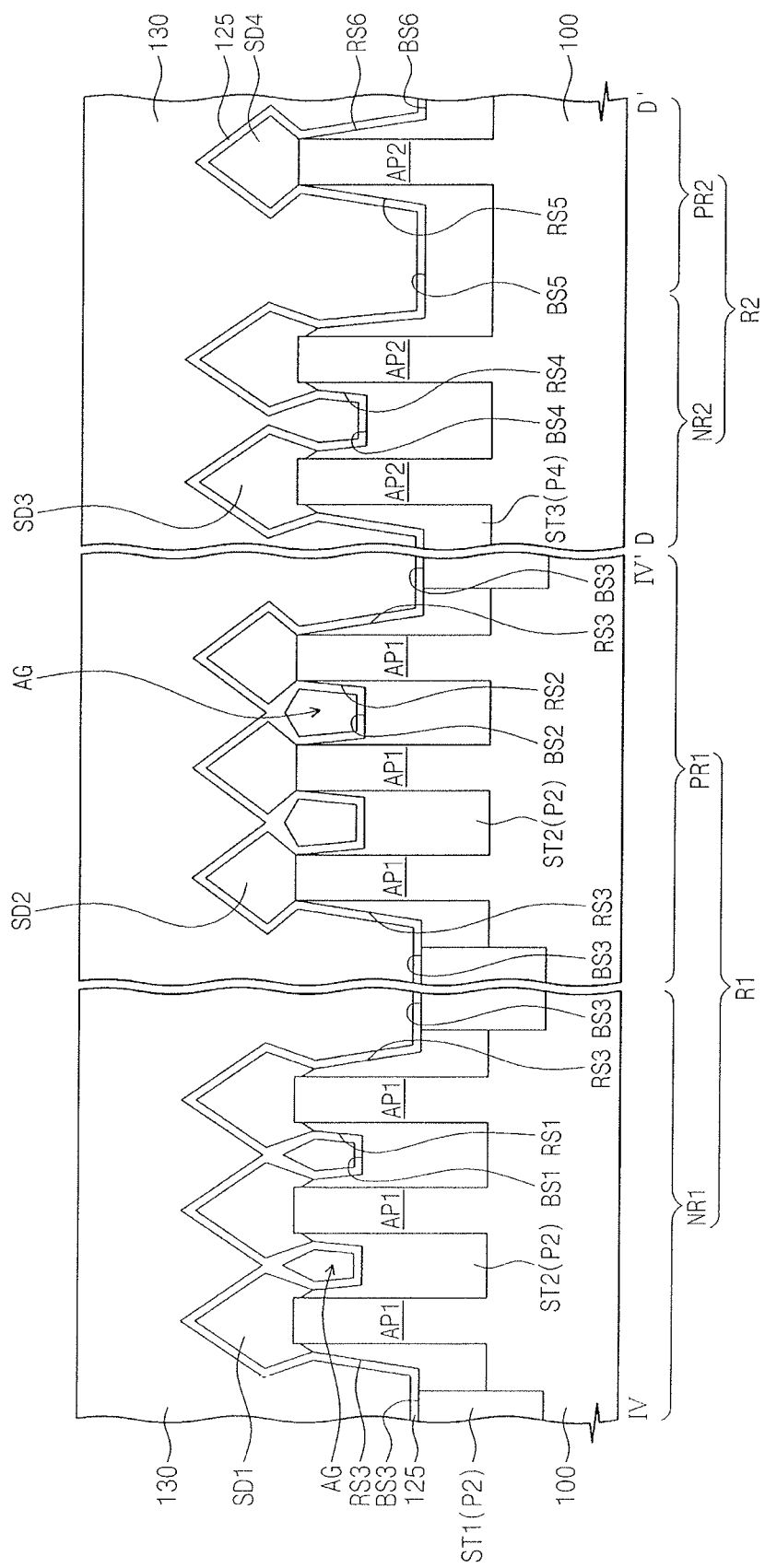

Referring to FIGS. 8A, 8B, and 8C, upper portions of second and fourth portions P2 and P4 of the first to third device isolation patterns ST1 to ST3 may be recessed. As a result, a plurality of recess regions may be formed in the second and fourth portions P2 and P4 of the first to third device isolation patterns ST1 to ST3. The plurality of recess regions may be defined by the recessed upper portions of the second and fourth portions P2 and P4. For example, the plurality of recess regions may include first, second, and third recess regions RS1, RS2, and RS3 disposed at one side of the first sacrificial gate pattern 110a. The first recess regions RS1 may be disposed between the first active patterns AP1 of the NMOSFET region NR1, and the second recess regions RS2 may be disposed between the first active recess regions RS2 of the PMOSFET region PR1. The third recess region RS3 may be formed at a side of the first active pattern AP1, adjacent to the first device isolation pattern ST1, of each of the active regions NR1 and PR1.

Recessed depths of the first to third recess regions RS1 to RS3 may be different from each other according to a pattern density. In other words, a recess region between first active patterns AP1 spaced apart from each other by a relatively small distance may be shallower than a recess region between the first active patterns AP1 spaced apart from each other by a relatively great distance. For example, bottom surfaces BS1 of the first recess regions RS1 may be higher than a bottom surface BS3 of the third recess region RS3. In addition, bottom surfaces BS2 of the second recess regions RS2 may also be higher than the bottom surface BS3 of the third recess region RS3. Furthermore, the bottom surfaces BS1 of the first recess regions RS1 may be disposed at the substantially same height as each other. Likewise, the bottom surfaces BS2 of the second recess regions RS2 may be disposed at the substantially same height as each other.

In addition, the plurality of recess regions may further include fourth, fifth, and sixth recess regions RS4, RS5, and RS6 disposed at one side of the second sacrificial gate pattern 110b. The fourth recess region RS4 may be disposed between the second active patterns AP2 of the NMOSFET region NR2, and the fifth recess region RS5 may be formed between the second active pattern AP2 of the PMOSFET region PR2 and the second active pattern AP2 of the NMOSFET region NR2 adjacent thereto. The sixth recess regions RS6 may be respectively disposed at both sides of the three second active patterns AP2. As described above, recessed depths of the fourth to sixth recess regions RS4 to RS6 may be different from each other according to a pattern density. For example, a bottom surface BS4 of the fourth recess region R4 may be higher than bottom surfaces BS5 and BS6 of the fifth and sixth recess regions RS5 and RS6.

Thereafter, a contact etch stop layer 125 may be conformally formed on the substrate 100. The contact etch stop layer 125 may cover inner surfaces of the recess regions of the device isolation patterns ST1 to ST3 and may extend onto the first to fourth source/drain regions SD1 to SD4 and the first and second gate mask patterns 115a and 115b. The contact etch stop layer 125 may be formed of a material having an etch selectivity with respect to a first interlayer insulating layer 130 to be described later. For example, the contact etch stop layer 125 may include a silicon nitride layer and/or a silicon oxynitride layer. The contact etch stop layer 125 may be formed by a CVD process or an ALD process.

The first interlayer insulating layer 130 may be formed on the substrate 100 having the contact etch stop layer 125. The first interlayer insulating layer 130 may be formed to cover the source/drain regions SD1 to SD4 and the sacrificial gate patterns 110a and 110b. The first interlayer insulating layer 130 may include at least one of a silicon oxide layer or low-k dielectric layers. Next, a planarization process may be performed on the first interlayer insulating layer 130 until the top surfaces of the sacrificial gate patterns 110a and 110b are exposed. The planarization process may include an etch-back process and/or a chemical mechanical polishing (CMP) process. The exposed sacrificial gate patterns 110a and 110b may be removed to form first and second gap regions 140a and 140b. The first gap region 140a may expose the first active fins AF1 between the first gate spacers 121a, and the second gap region 140b may expose the second active fins AF2 between the second gate spacers 121b. The first and second gap regions 140a and 140b may be formed by selectively etching the sacrificial gate patterns 110a and 110b and the etch stop patterns 105a and 105b.

Figure 9A:
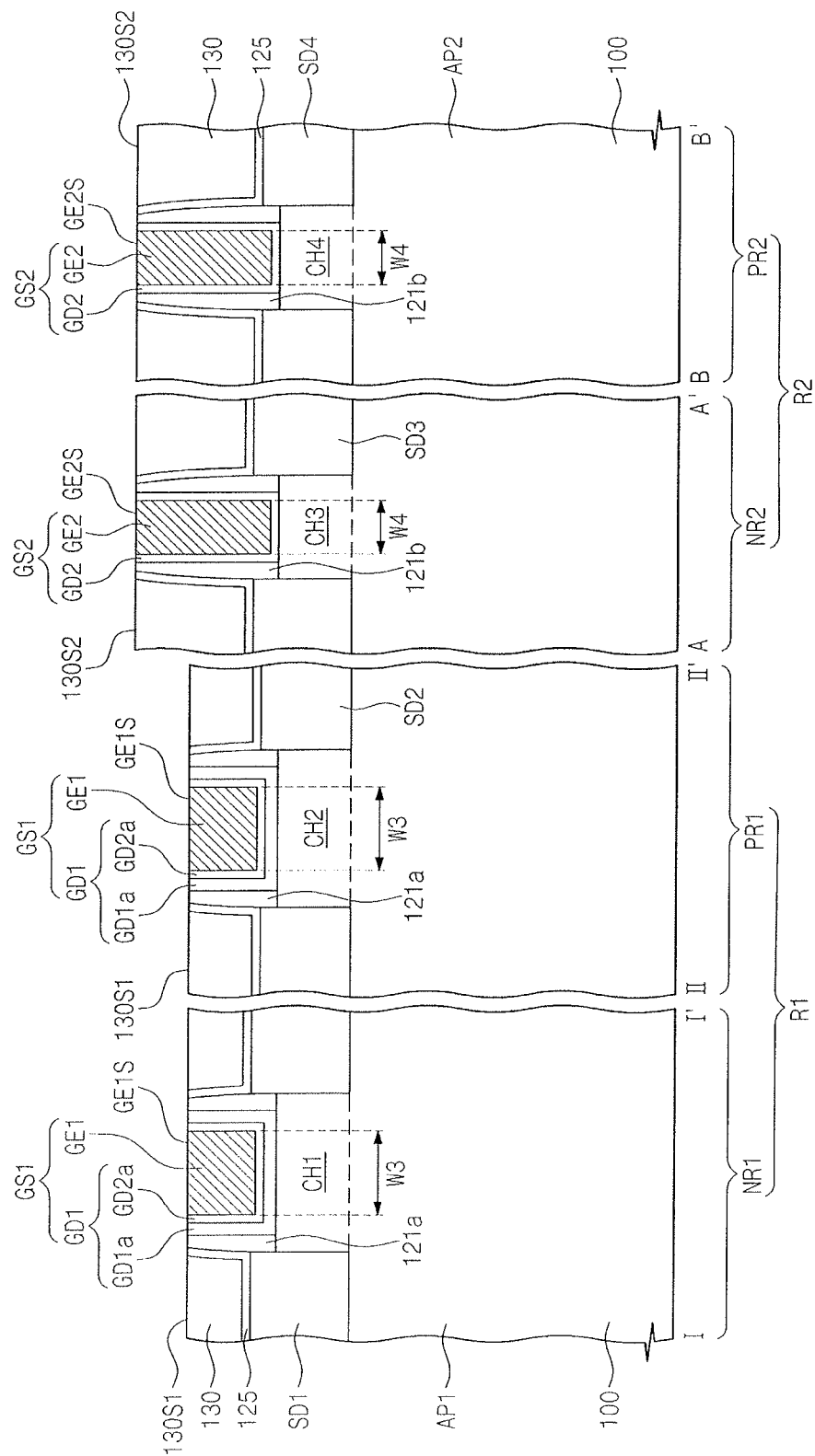
Figure 9B:
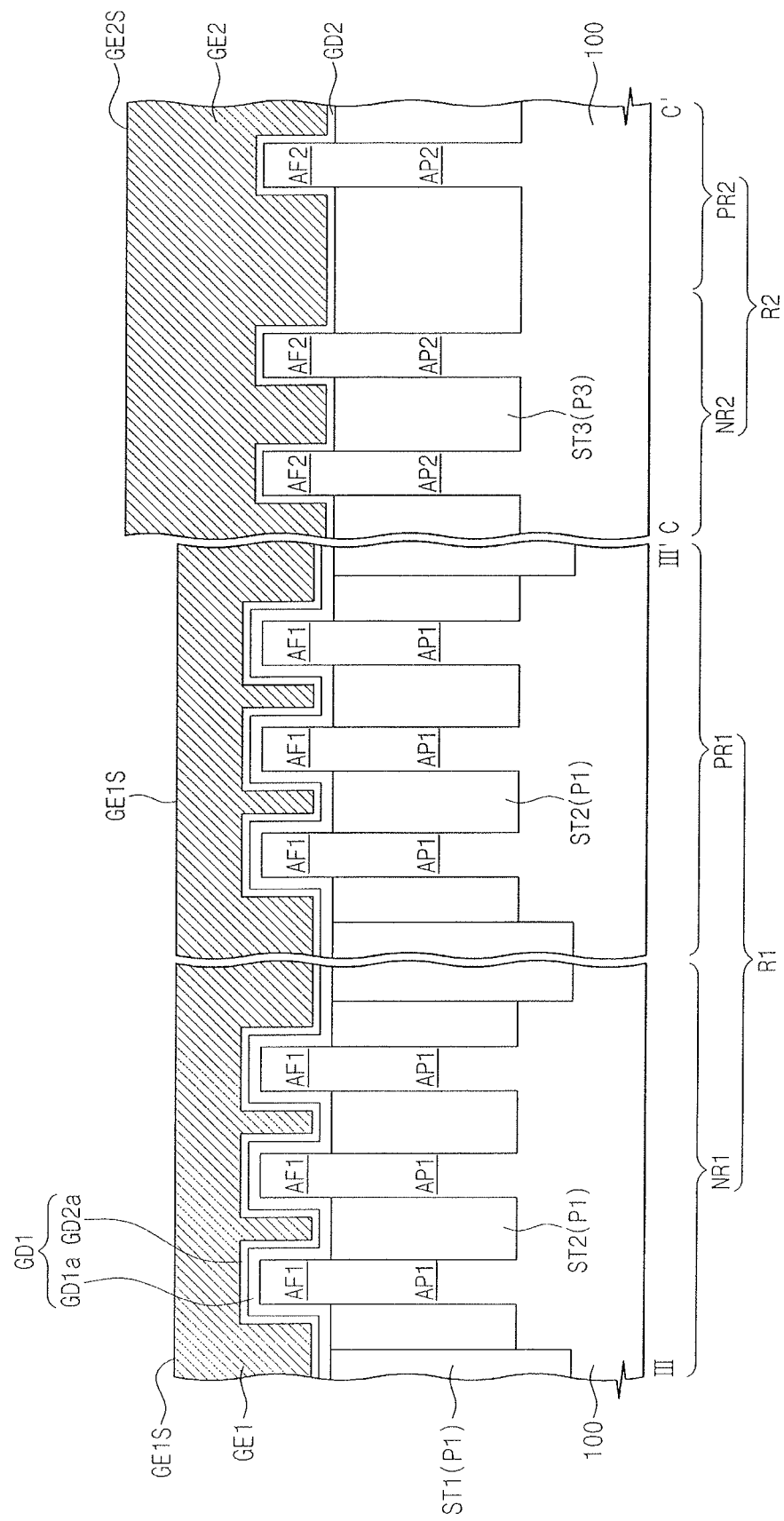
Figure 9C:
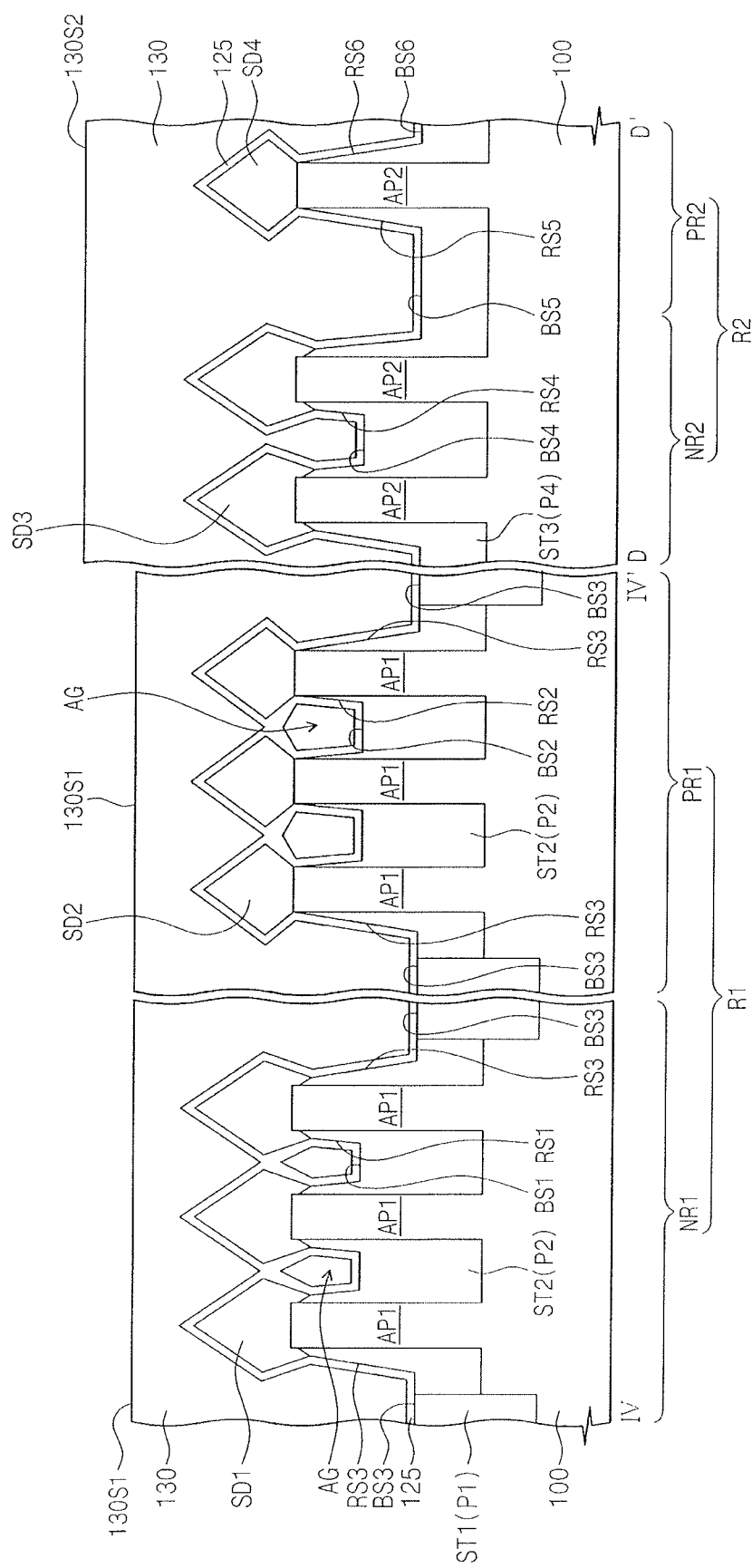

Referring to FIGS. 9A, 9B, and 9C, a first gate dielectric pattern GD1 and a first gate electrode GE1 may be formed to fill the first gap region 140a, and a second gate dielectric pattern GD2 and a second gate electrode GE2 may be formed to fill the second gap region 140b. In more detail, a first gate dielectric layer may be formed on the substrate 100 to partially fill the first and second gap regions 140a and 140b. The first gate dielectric layer may be formed to cover the first and second active fins AF1 and AF2. For example, the first gate dielectric layer may include a silicon oxide layer and/or a silicon oxynitride layer. Thereafter, the first gate dielectric layer disposed in the second gap region 140b may be selectively removed. Next, a second gate dielectric layer may be formed on the substrate 100 to partially fill the first and second gap regions 140a and 140b. The second gate dielectric layer may include at least one of high-k dielectric layers. In some embodiments, the second gate dielectric layer may include at least one of, but not limited to, a hafnium oxide layer, a hafnium silicate layer, a zirconium oxide layer, or a zirconium silicate layer. Each of the first and second gate dielectric layers may be formed by a CVD process or an ALD process.

A gate layer may be formed on the second gate dielectric layer to fill the rest regions of the first and second gap regions 140a and 140b. The gate layer may include at least one of a conductive metal nitride (e.g., titanium nitride or tantalum nitride) or a metal (e.g., aluminum or tungsten). The gate layer, the second gate dielectric layer, and the first gate dielectric layer may be planarized to form the first gate dielectric pattern GD1 and the first gate electrode GE1 in the first gap region 140a and to form the second gate dielectric pattern GD2 and the second gate electrode GE2 in the second gap region 140b. The first gate dielectric pattern GD1 may include a first sub-gate dielectric pattern GD1a and a second sub-gate dielectric pattern GD2a which are formed from the first gate dielectric layer and the second gate dielectric layer, respectively. According to embodiments, a height difference may occur between a top surface GE1S of the first gate electrode GE1 and a top surface GE2S of the second gate electrode GE2 due to the above mentioned planarization process. In other word, the top surface GE1S of the first gate electrode GE1 may be lower than the top surface GE2S of the second gate electrode GE2. This may be because an etch rate of the gate layer in the first gap region 140a may be different from that of the gate layer in the second gap region 140b due to widths of the gap regions 140a and 140b during the planarization process of the gate layer. In other word, since the width W1 of the first gap region 140a is greater than the width W2 of the second gap region 140b, the etch rate of the gate layer in the first gap region 140a may be higher than that of the gate layer in the second gap region 140b.

Top surfaces of the first interlayer insulating layer 130 and the gate spacers 121a and 121b may be exposed by the planarization process. A top surface 130S1 of the planarized first interlayer insulating layer 130 of the first region R1 may be substantially coplanar with the top surface GE1S of the first gate electrode GE1. A top surface 130S2 of the planarized first interlayer insulating layer 130 of the second region R2 may be substantially coplanar with the top surface GE2S of the second gate electrode GE2. The first gate dielectric pattern GD1 may extend along a bottom surface of the first gate electrode GE1 and may be disposed on both sidewalls of the first gate electrode GE1 so as to be disposed between the first gate electrode GE1 and the first gate spacers 121a. The second gate dielectric pattern GD2 may extend along a bottom surface of the second gate electrode GE2 and may be disposed on both sidewalls of the second gate electrode GE2 so as to be disposed between the second gate electrode GE2 and the second gate spacers 121b.

The first active fins AF1 of the NMOSFET region NR1 under the first gate electrode GE1 may be defined as first channel regions CH1, and the first active fins AF1 of the PMOSFET region PR1 under the first gate electrode GE1 may be defined as second channel regions CH2. Each of the first channel regions CH1 may be disposed between the first source/drain regions SD1, and each of the second channel regions CH2 may be disposed between the second source/drain regions SD2. The second active fins AF2 of the NMOSFET region NR2 under the second gate electrode GE2 may be defined as third channel regions CH3, and the second active fins AF2 of the PMOSFET region PR2 under the second gate electrode GE2 may be defined as fourth channel regions CH4. Each of the third channel regions CH3 may be disposed between the third source/drain regions SD3, and each of the fourth channel regions CH4 may be disposed between the fourth source/drain regions SD4. The first gate dielectric pattern GD1 and the first gate electrode GE1 may be defined as a first gate structure GS1, and the second gate dielectric pattern GD2 and the second gate electrode GE2 may be defined as a second gate structure GS2.

Figure 10A:
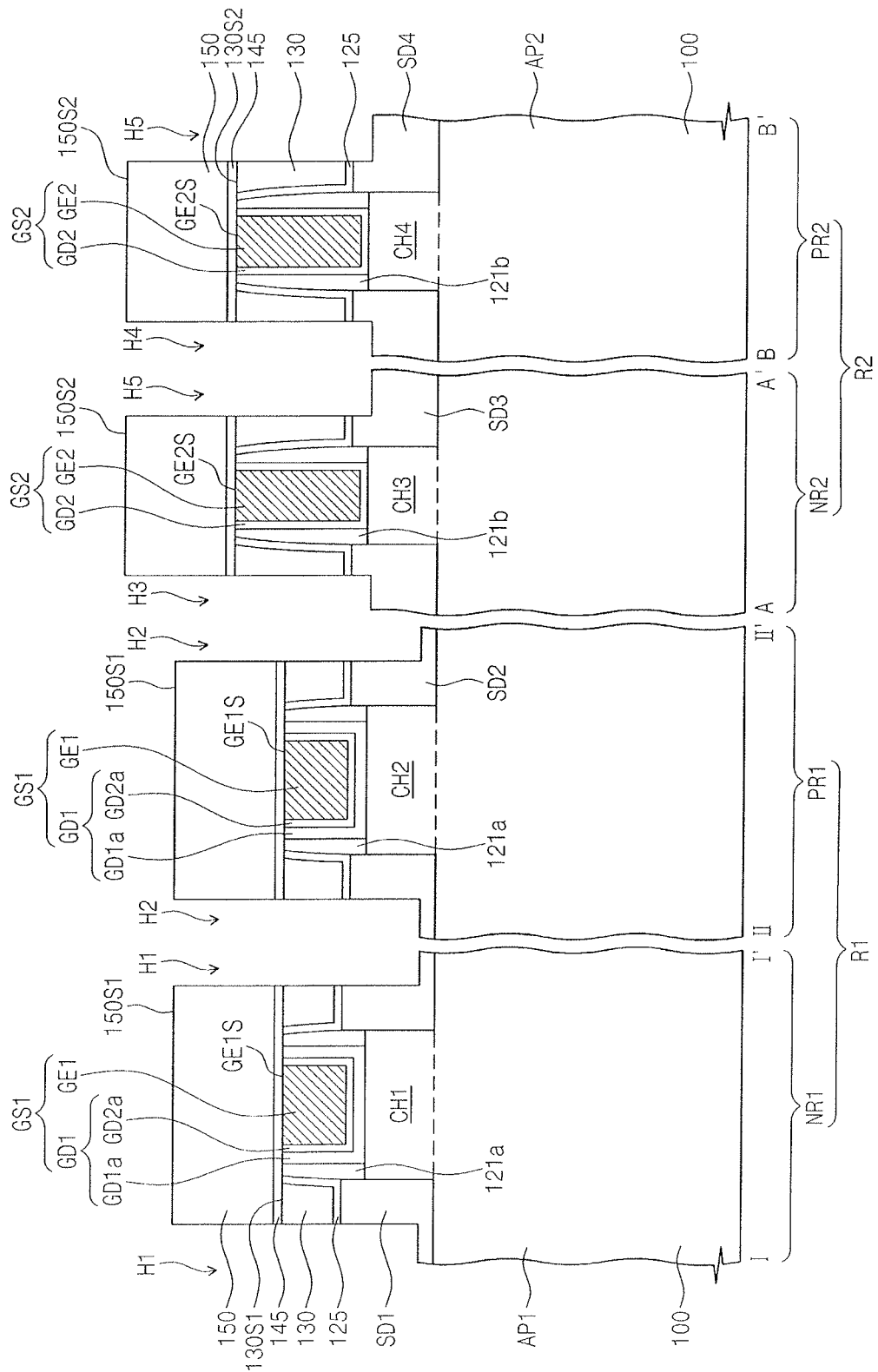
Figure 10B:
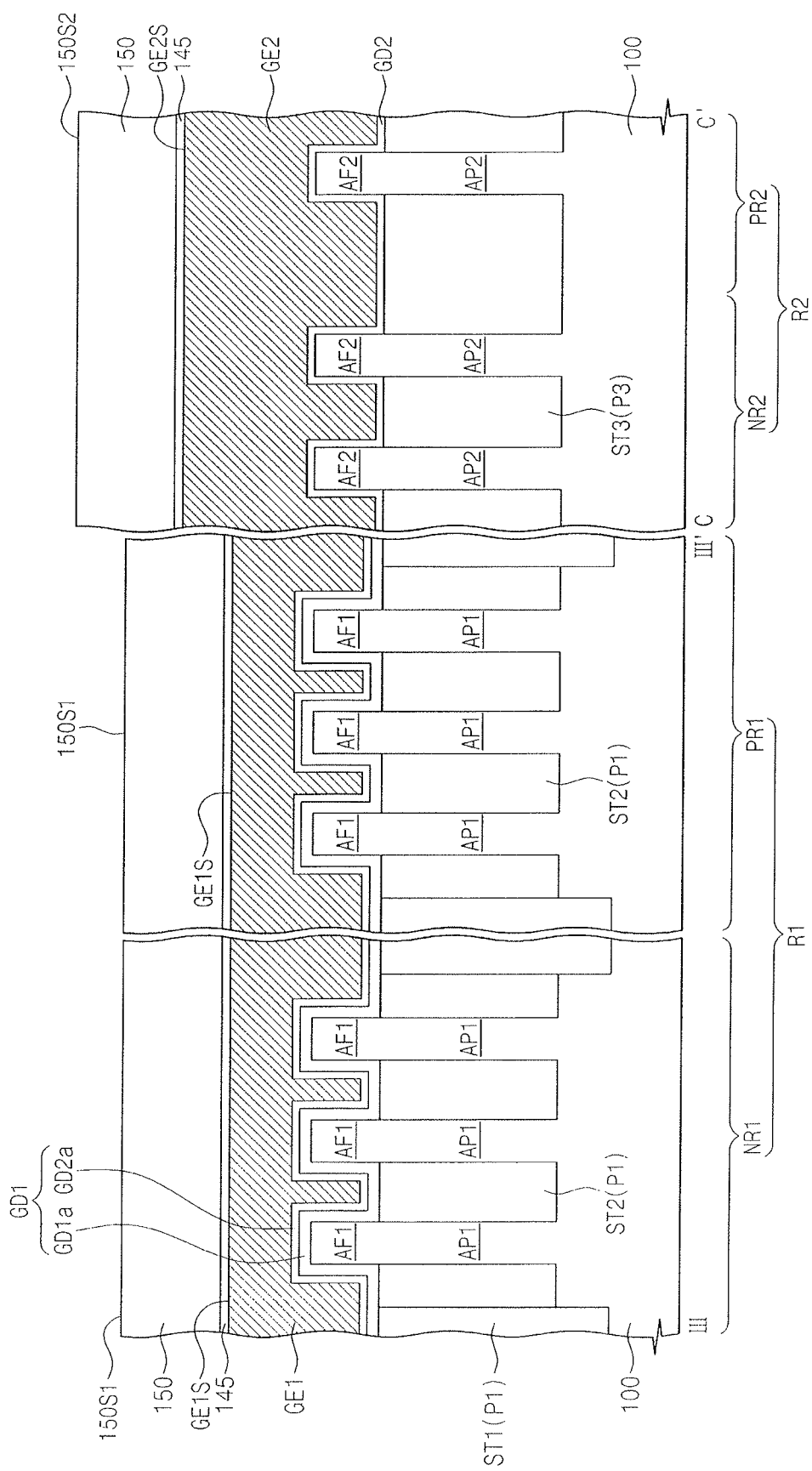
Figure 10C:
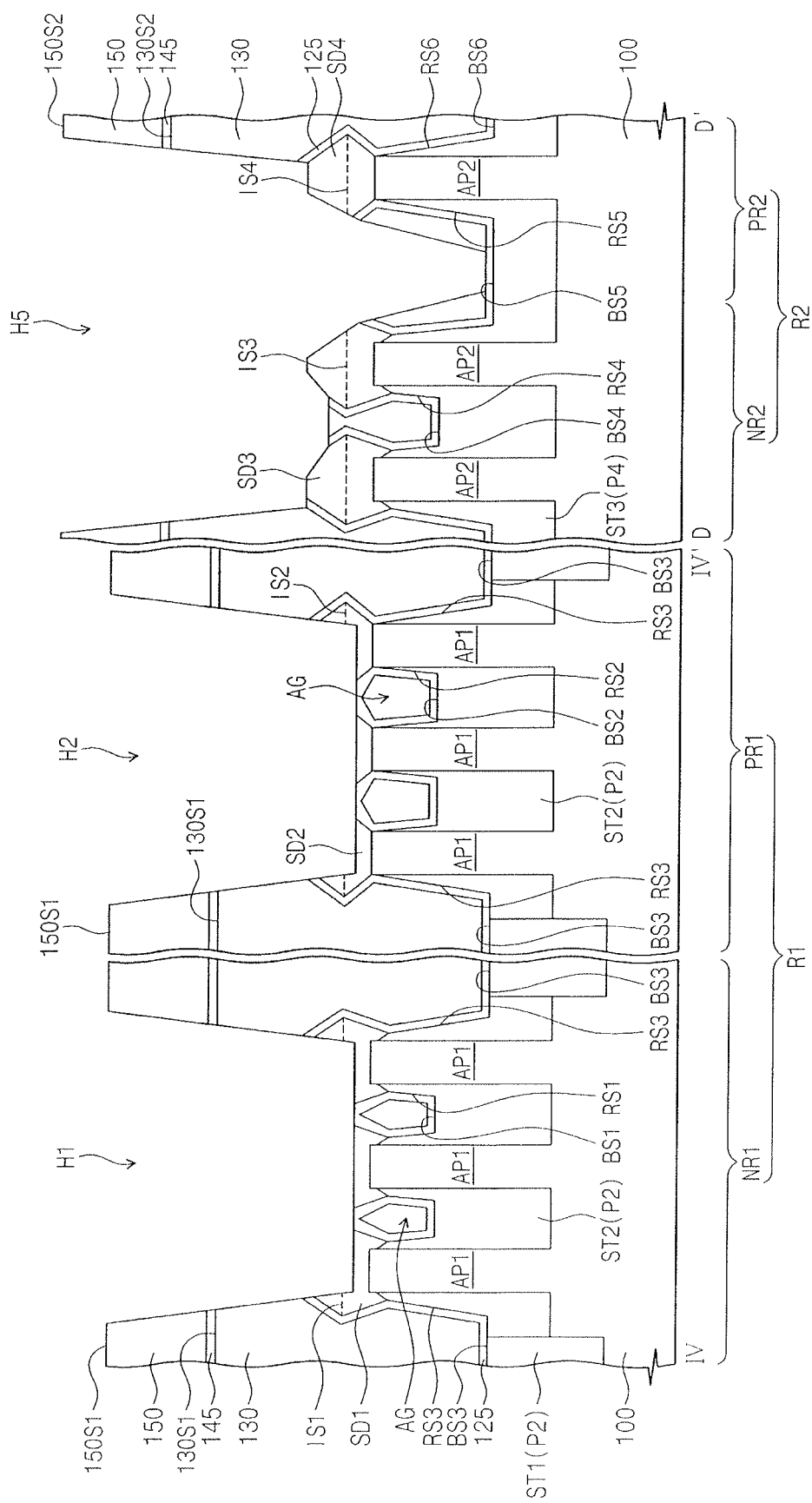

Referring to FIGS. 10A, 10B, and 10C, a gate capping layer 145 and a second interlayer insulating layer 150 may be sequentially formed on the resultant structure including the first and second gate electrodes GE1 and GE2. The gate capping layer 145 may cover the gate structures GS1 and GS2 and the first interlayer insulating layer 130. For example, the gate capping layer 145 may include a silicon nitride layer. The second interlayer insulating layer 150 may include at least one of a silicon oxide layer, a silicon nitride layer, a silicon oxynitride, or low-k dielectric layers. Each of the gate capping layer 145 and the second interlayer insulating layer 150 may be formed by, for example, a CVD process. Due to the height difference between the first and second gate electrodes GE1 and GE2, a height difference may also occur between the second interlayer insulating layer 150 of the first region R1 and the second interlayer insulating layer 150 of the second region R2. In other words, a top surface 150S1 of the second interlayer insulating layer 150 of the first region R1 may be lower than a top surface 150S2 of the second interlayer insulating layer 150 of the second region R2.

Next, first to fifth contact holes H1 to H5 may be formed to penetrate the second interlayer insulating layer 150, the gate capping layer 145, the first interlayer insulating layer 130, and the contact etch stop layer 125. The first to fifth contact holes H1 to H5 may expose the source/drain regions SD1 to SD4. The first contact holes H1 may expose the first source/drain regions SD1 at both sides of the first gate structure GS1, and the second contact holes H2 may expose the second source/drain regions SD2 at both sides of the first gate structure GS1. The third contact hole H3 may expose the third source/drain regions SD3 disposed at one side of the second gate structure GS2, and the fourth contact hole H4 may expose the fourth source/drain region SD4 disposed at the one side of the second gate structure GS2. The fifth contact hole H5 may expose the third and fourth source/ drain regions SD3 and SD4 disposed at another side of the second gate structure GS2. A mask pattern (not shown) may be formed on the second interlayer insulating layer 150, and then, an anisotropic etching process may be performed using the mask pattern as an etch mask to form the first to fifth contact holes H1 to H5. In some embodiments, upper portions of the first to fourth source/drain regions SD1 to SD4 exposed through the first to fifth contact holes H1 to H5 may be partially etched by the anisotropic etching process. According to embodiments, since the first and second gate electrodes GE1 and GE2 have the height difference, the height difference may occur between the top surfaces 130S1 and 130S2 of the first interlayer insulating layer 130 of the first and second regions R1 and R2. In other words, the top surface 130S1 of the first interlayer insulating layer 130 of the first region R1 may be lower than the top surface 130S2 of the first interlayer insulating layer 130 of the second region R2. That is, a thickness of the first interlayer insulating layer 130 of the first region R1 may be smaller than a thickness of the first interlayer insulating layer 130 of the second region R2. Thus, during the anisotropic etching process, the first and second source/drain regions SD1 and SD2 may be exposed by the first and second contact holes H1 and H2 before the third and fourth source/drain regions SD3 and SD4 are exposed by the third to fifth contact holes H3 to H5. As a result, the upper portions of the first and second source/drain regions SD1 and SD2 may be over-etched, so the first and second contact holes H1 and H2 may be formed to have bottom surfaces disposed at a lower level than the first and second interfaces IS1 and IS2 of the first and second source/drain regions SD1 and SD2. Meanwhile, a bottom surface of the fifth contact hole H5 may have a plurality of flat surfaces and a plurality of inclined surfaces due to an etch rate difference according to the pattern density. In addition, the fifth contact hole H5 may be formed to expose the contact etch stop layer 125 disposed on the bottom surface BS5 of the fifth recess region RS5.

Referring again to FIGS. 2A, 2B, and 2C, first to fifth source/drain contacts CT1 to CT5 may be formed in the first to fifth contact holes H1 to H5 of FIGS. 10A and 10C, respectively. Each of the first and second source/drain contacts CT1 and CT2 may include a first conductive pattern 160a and a second conductive pattern 165a disposed on the first conductive pattern 160a. Each of the third, fourth, and fifth source/drain contacts CT3, CT4, and CT5 may include a first conductive pattern 160b and a second conductive pattern 165b disposed on the first conductive pattern 160b. In more detail, a conductive material layer may be formed on the substrate 100 to fill the first to fifth contact holes H1 to H5, and then, the conductive material layer may be planarized until the top surface of the second interlayer insulating layer 150 is exposed, thereby forming the first to fifth source/drain contacts CT1 to CT5. In some embodiments, forming the conductive material layer may include sequentially depositing a first conductive layer and a second conductive layer. The first conductive layer may include a barrier conductive layer. For example, the first conductive layer may include at least one of a titanium nitride layer, a tungsten nitride layer, or a tantalum nitride layer. The second conductive layer may include a metal layer. For example, the second conductive layer may include at least one of tungsten, titanium, or tantalum. Even though not shown in the drawings, a thermal treatment process may be performed after the formation of the first conductive layer to form a metal silicide layer between the first conductive layer and each of the source/drain regions SD1 to SD4. For example, the metal silicide layer may include at least one of titanium silicide, tantalum silicide, or tungsten silicide.

Even though not shown in the drawings, interconnections respectively connected to the first to fifth source/drain contacts CT1 to CT5 may be formed on the second interlayer insulating layer 150. The interconnections may include a conductive material.

Figure 11:
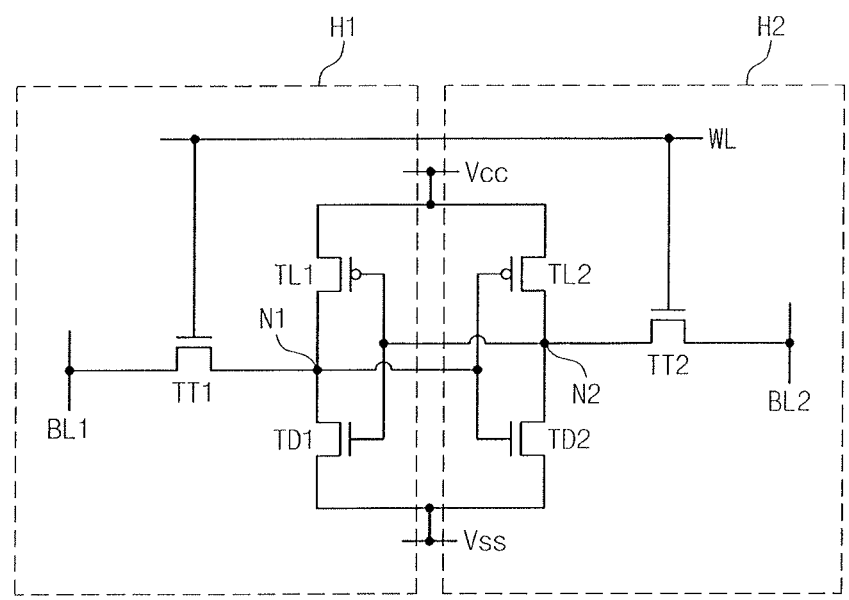
FIG. 11 illustrates an equivalent circuit diagram of a complementary metal-oxide-semiconductor static random access memory cell (CMOS SRAM cell) including a field effect transistor according to example embodiments.

FIG. 11 is an equivalent circuit diagram of a complementary metal-oxide-semiconductor static random access memory cell (CMOS SRAM cell) including a field effect transistor according to example embodiments. Referring to FIG. 11, a CMOS SRAM cell may include a pair of driver transistors TD1 and TD2, a pair of transfer transistors TT1 and TT2, and a pair of load transistors TL1 and TL2. The driver transistors TD1 and TD2 may correspond to pull-down transistors, the transfer transistors TT1 and TT2 may correspond to pass transistors, and the load transistors TL1 and TL2 may correspond to pull-up transistors. The driver transistors TD1 and TD2 and the transfer transistors TT1 and TT2 may be NMOS transistors, and the load transistors TL1 and TL2 may be PMOS transistors. At least one of the driver transistors TD1 and TD2 and the transfer transistors TT1 and TT2 may be the third transistor TR3 of FIG. 1 according to the above embodiments, and at least one of the driver transistors TL1 and TL2 may be the fourth transistor TR4 of FIG. 1 according to the above embodiments.

The first driver transistor TD1 and the first transfer transistor TT1 may be in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be in series to each other. A source region of the second driver transistor TD2 may be electrically connected to the ground line Vss, and a drain region of the second transfer transistor TT2 may be electrically connected to a second bit line BL2.

A source region and a drain region of the first load transistor TL1 may be electrically connected to a power line Vcc and a drain region of the first driver transistor TD1, respectively. A source region and a drain region of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may correspond to a first node N1. The drain region of the second load transistor TL2, the drain region of the second driver transistor TD2, and a source region of the second transfer transistor TT2 may correspond to a second node N2. A gate electrode of the first driver transistor TD1 and a gate electrode of the first load transistor TL1 may be electrically connected to the second node N2. A gate electrode of the second driver transistor TD2 and a gate electrode of the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half-cell H1. The second driver transistor TD2, the second transfer transistor TT2, and the second load transistor TL2 may constitute a second half-cell H2.

Figure 12:
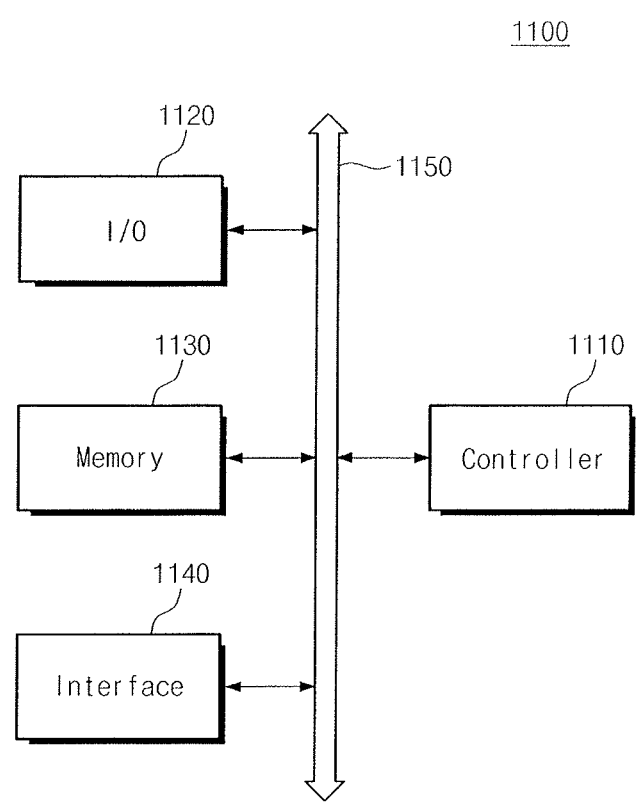
FIG. 12 illustrates a schematic block diagram of an electronic system including a semiconductor device according to embodiments.

FIG. 12 is a schematic block diagram illustrating an electronic system including a semiconductor device according to embodiments.

Referring to FIG. 12, an electronic system 1100 according to an embodiment may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. Although not shown in the drawings, the electronic system 1100 may further include a fast dynamic random access memory (DRAM) device and/or a fast SRAM device which acts as a cache memory for improving an operation of the controller 1110. At least one of the semiconductor devices according to the aforementioned embodiments may be provided in the memory device 1130 and/or may be provided in the controller 1110 and/or the I/O 1120.

The electronic system 1100 may be applied to a personal digital assistant (PDA), a portable computer, a web tablet, a wireless phone, a mobile phone, a digital music player, a memory card, or other electronic products receiving or transmitting information data by wireless.

Figure 13:
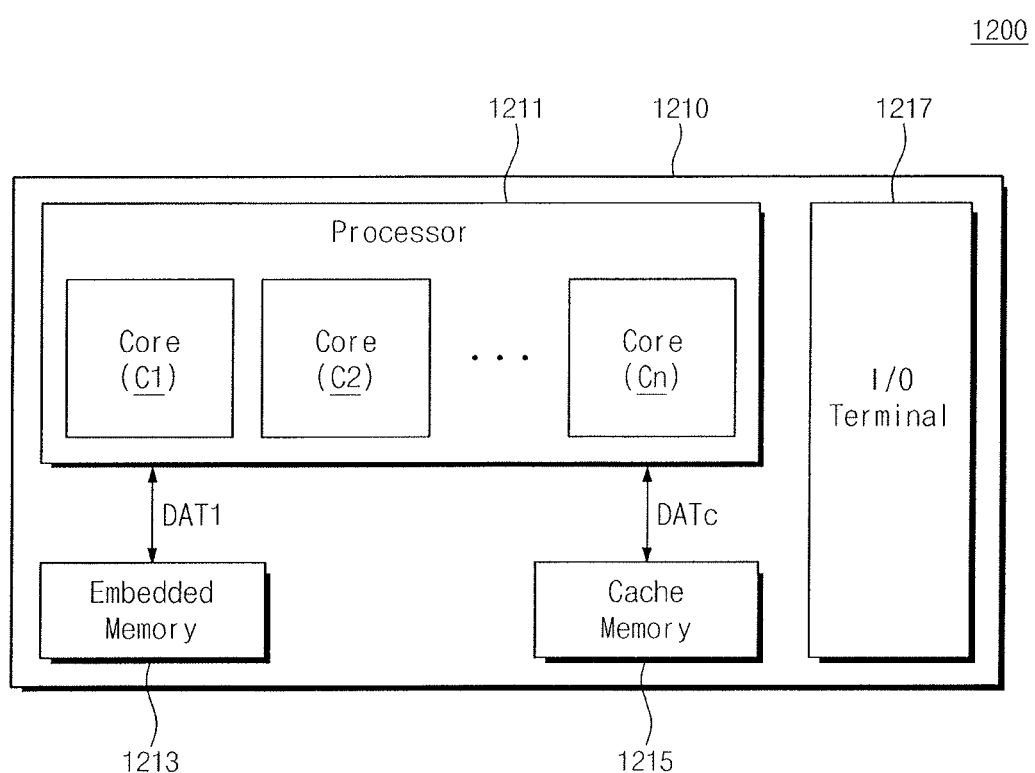
FIG. 13 illustrates a schematic block diagram of an electronic device including a semiconductor device according to embodiments.

FIG. 13 is a schematic block diagram illustrating an electronic device including a semiconductor device according to embodiments.

Referring to FIG. 13, an electronic device 1200 may include a semiconductor chip 1210. The semiconductor device 1210 may include a processor 1211, an embedded memory 1213, a cache memory 1215, and an input/output (I/O) terminal 1217.

The processor 1211 may include one or more processor cores C1 to Cn. The one or more process cores C1 to Cn may process electrical data and/or electrical signals.

The electronic device 1200 may perform a specific function by means of the processed data and signals. For example, the processor 1211 may be an application processor.

The embedded memory 1213 may exchange first data DAT1 with the processor 1211. The first data DAT1 may be data processed or to be processed by the one or more processor cores C1 to Cn. The embedded memory 1213 may manage the first data DAT1. For example, the embedded memory 1213 may buffer the first data DAT1. In other words, the embedded memory 1213 may act as a buffer memory or a working memory of the processor 1211.

In some embodiments, the electronic device 1200 may be applied to a wearable electronic device. The wearable electronic device may mainly perform a function requiring a relatively small quantity of operations. Thus, if the electronic device 1200 is applied to the wearable electronic device, the embedded memory 1213 may not have a great buffer capacity.

The embedded memory 1213 may be a SRAM. An operating speed of the SRAM may be faster than that of a DRAM. When the SRAM is embedded in the semiconductor chip 1210, it is possible to realize the electronic device 1200 having a small size and a fast operating speed. In addition, when the SRAM is embedded in the semiconductor chip 1210, consumption of an active power of the electronic device 1200 may be reduced. The SRAM may include the semiconductor device according to the above mentioned embodiments.

The cache memory 1215 may be mounted on the semiconductor chip 1210 along with the one or more process cores C1 to Cn. The cache memory 1215 may store cache data DATc. The cache data DATc may be data used by the one or more process cores C1 to Cn. The cache memory 1215 may have a relatively small capacity but may have a very fast operating speed. The cache memory 1215 may include a SRAM including the semiconductor device according to the above mentioned embodiments. When the cache memory 1215 is used, it is possible to reduce an accessing number and an accessing time of the processor 1211 with respect to the embedded memory 1213. Thus, the operating speed of the electronic device 1200 may be improved when the cache memory 1215 is used.

The I/O terminal 1217 may control an operation of supplying an operating voltage to the processor 1211. In other words, the processor cores C1 to Cn of the processor 1211 may be stably supplied with the voltage through the I/O terminal 1217. The I/O terminal 1217 may include the first and second transistors TR1 and TR2 of FIG. 1 according to the above mentioned embodiments.

In FIG. 13, the cache memory 1215 is distinguished from the processor 1211 for the purpose of ease and convenience in explanation. However, in other embodiments, the cache memory 1215 may be configured to be included in the processor 1211. In other words, embodiments are not limited to those illustrated in FIG. 13.

The processor 1211, the embedded memory 1213, and the cache memory 1215 may transmit electrical data on the basis of at least one of various interface protocols. For example, the processor 1211, the embedded memory 1213, and the cache memory 1215 may transmit electrical data on the basis of at least one interface protocol of universal serial bus (USB), small computer system interface (SCSI), peripheral component interconnect (PCI) express, advanced technology attachment (ATA), parallel ATA (PATA), serial ATA (SATA), serial attached SCSI (SAS), integrated drive electronics (IDE), or universal flash storage (UFS).

Figure 14:
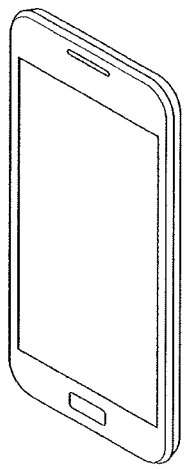
FIG. 14 illustrates a mobile phone implemented with an electronic system according to embodiments.
Figure 15:
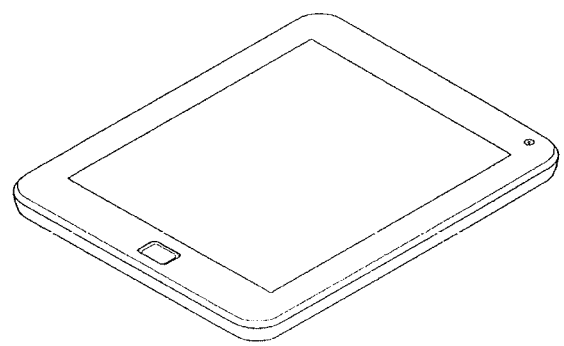
FIG. 15 illustrates a tablet or smart tablet implemented with an electronic system according to embodiments.
Figure 16:
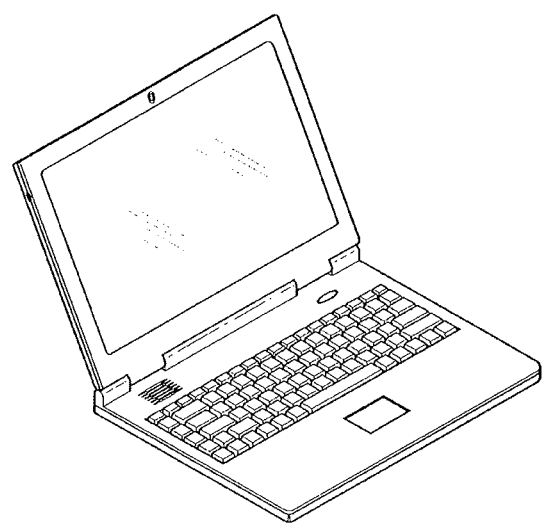
FIG. 16 illustrates a notebook computer implemented with an electronic system according to embodiments.

The electronic system 1100 of FIG. 12 may be applied to electronic control systems of various electronic devices. FIG. 14 illustrates a mobile phone 2000 implemented with then electronic system 1100 of FIG. 12. In other embodiments, the electronic system 1100 of FIG. 12 may be applied to a tablet or smart tablet 3000 illustrated in FIG. 15 and/or a notebook computer 4000 illustrated in FIG. 16.

According to example embodiments, the source/drain contacts connected in common to the plurality of source/drain regions of each region may be realized as various shapes. Thus, a contact area between each source/drain contact and the source/drain regions disposed thereunder can be adjusted to realize a source/drain contact resistance desired in each region. As a result, electrical characteristics of the semiconductor device may be optimized to improve reliability of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first active pattern and a second active pattern in a first region having a first conductivity type, the first and second active patterns protruding from a substrate;
a first device isolation pattern on the substrate and between the first and second active patterns;
a first source/drain region and a second source/drain region electrically connected to the first and second active patterns, respectively;
a source/drain contact electrically connected to both of the first and second source/drain regions; and
a third active pattern in a second region having a second conductivity type that is different from the first conductivity type, the third active pattern protruding from a substrate,
wherein the second active pattern is between the first active pattern and the third active pattern,
wherein the first source/drain region includes:
a lower portion having a width substantially increasing as a distance from the substrate increases; and
an upper portion on the lower portion, the upper portion having a width substantially decreasing as a distance from the substrate increases,
wherein the source/drain contact has a bottommost surface that is between the second and third active patterns, and
wherein the bottommost surface of the source/drain contact is lower than an interface between the lower and upper portions of the first source/drain region.

2. The semiconductor device as claimed in claim 1, further comprising an air gap between the first active pattern and the second active pattern and below the source/drain contact.

3. The semiconductor device as claimed in claim 1, further comprising a second device isolation pattern on the substrate and between the second and third active patterns.

4. The semiconductor device as claimed in claim 3, wherein the bottommost surface is spaced apart from the first device isolation patterns.

5. The semiconductor device as claimed in claim 1, wherein a first distance between the first and second active patterns is less than a second distance between the second and third active patterns.

6. The semiconductor device as claimed in claim 1, wherein the first and second source/drain regions have the same conductivity type.

7. The semiconductor device as claimed in claim 1, wherein the source/drain contact has a waved bottom surface on the first source/drain region and the second source/drain region.

8. The semiconductor device as claimed in claim 1, further comprising an etch stop layer between the bottommost surface of the source/drain contact and the first device isolation pattern.

9. A semiconductor device, comprising:
a first active pattern and a second active pattern, the first and second active patterns protruding from a substrate;
a first device isolation pattern on the substrate and between the first and second active patterns;
a first source/drain region and a second source/drain region electrically connected to the first and second active patterns, respectively;
a source/drain contact electrically connected to both of the first and second source/drain regions;
a third active pattern protruding from a substrate; and
an air gap between the first active pattern and the second active pattern and below the source/drain contact,
wherein the second active pattern is between the first active pattern and the third active pattern,
wherein the first source/drain region includes:
a lower portion having a width substantially increasing as a distance from the substrate increases; and
an upper portion on the lower portion, the upper portion having a width substantially decreasing as a distance from the substrate increases,
wherein the source/drain contact has a bottommost surface that is between the second and third active patterns, and
wherein the bottommost surface of the source/drain contact is lower than an interface between the lower and upper portions of the first source/drain region.

10. The semiconductor device as claimed in claim 9, further comprising a second device isolation pattern on the substrate and between the second and third active patterns.

11. The semiconductor device as claimed in claim 10, wherein the bottommost surface is spaced apart from the first device isolation patterns.

12. The semiconductor device as claimed in claim 11, further comprising an etch stop layer between the bottommost surface of the source/drain contact and the second device isolation pattern.

13. The semiconductor device as claimed in claim 9, further comprising an etch stop layer between the bottommost surface of the source/drain contact and the first device isolation pattern.

14. The semiconductor device as claimed in claim 9, wherein a first distance between the first and second active patterns is less than a second distance between the second and third active patterns.

15. The semiconductor device as claimed in claim 9, wherein the first and second active patterns are in a first region having a first conductivity type.

16. The semiconductor device as claimed in claim 15, wherein the third active pattern is in a second region having a second conductivity type that is different from the first conductivity type.

17. The semiconductor device as claimed in claim 9, wherein the source/drain contact has a waved bottom surface on the first source/drain region and the second source/drain region.

18. A semiconductor device, comprising:
a first active pattern and a second active pattern, the first and second active patterns protruding from a substrate;
a first device isolation pattern on the substrate and between the first and second active patterns;
a first source/drain region and a second source/drain region electrically connected to the first and second active patterns, respectively;
a source/drain contact electrically connected to both of the first and second source/drain regions;
a third active pattern protruding from a substrate;
a second device isolation pattern on the substrate and between the second and third active patterns; and
a third source/drain region electrically connected to the third active pattern, wherein the second active pattern is between the first and third active patterns, wherein the first source/drain region includes:
- a first lower portion having a width substantially increasing as a distance from the substrate increases; and
- a first upper portion on the lower portion, the upper portion having a width substantially decreasing as a distance from the substrate increases, wherein the third source/drain region includes:
- a second lower portion having a width substantially increasing as a distance from the substrate increases; and
- a second upper portion on the lower portion, the upper portion having a width substantially decreasing as a distance from the substrate increases, wherein a portion of the source/drain contact extends between the second and third active patterns, a bottommost surface of the source/drain contact being between the second and third active patterns, and wherein a first distance between the first and second active patterns is less than a second distance between the second and third active patterns.

19. The semiconductor device as claimed in claim 18, further comprising an air gap between the first active pattern and the second active pattern, the air gap being below the source/drain contact.

20. The semiconductor device as claimed in claim 18, wherein the source/drain contact has a waved bottom surface on the first source/drain region and the second source/drain region.

* * * * *